US011152275B2

(12) United States Patent
Kajihara et al.

(10) Patent No.: US 11,152,275 B2
(45) Date of Patent: Oct. 19, 2021

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Takanobu Kajihara, Tokyo (JP); Katsuhiko Omae, Tokyo (JP); Shunsuke Fushie, Tokyo (JP); Yoshinori Kaneto, Tokyo (JP); Junya Suzuki, Tokyo (JP); Yuki Okabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 561 days.

(21) Appl. No.: 16/070,350

(22) PCT Filed: Mar. 7, 2016

(86) PCT No.: PCT/JP2016/056975
§ 371 (c)(1),
(2) Date: Jul. 16, 2018

(87) PCT Pub. No.: WO2017/154072
PCT Pub. Date: Sep. 14, 2017

(65) Prior Publication Data
US 2021/0175141 A1    Jun. 10, 2021

(51) Int. Cl.
*H01L 23/31* (2006.01)
*H01L 21/56* (2006.01)
(Continued)

(52) U.S. Cl.
CPC ........ *H01L 23/3135* (2013.01); *H01L 21/565* (2013.01); *H01L 23/3142* (2013.01);
(Continued)

(58) Field of Classification Search
CPC ............. H01L 23/3135; H01L 23/3142; H01L 23/49568; H01L 21/565
See application file for complete search history.

(56) References Cited

U.S. PATENT DOCUMENTS 5,703,399 A    12/1997  Majumdar et al.
6,340,837 B1 *  1/2002  Miyaki ................ H01L 21/565
                                                      257/666
(Continued)

FOREIGN PATENT DOCUMENTS

CN    102348332 A    2/2012
CN    102623360 A    8/2012
(Continued)

OTHER PUBLICATIONS

Communication dated Feb. 20, 2019, from European Patent Office in counterpart application No. 16893404.0.
(Continued)

*Primary Examiner* — Marc Anthony Armand
(74) *Attorney, Agent, or Firm* — Sughrue Mion, PLLC; Richard C. Turner

(57) ABSTRACT

A semiconductor device includes a first insulating resin member sealing a mounting surface of a lead frame, and a second insulating resin member sealing a heat dissipating surface. The second insulating resin member contains a filler having a maximum diameter of 0.02 mm to 0.075 mm. The second insulating resin member includes a thin molded portion formed in contact with the heat dissipating surface of the lead frame. The thin molded portion has a thickness 1.1 times to 2 times the maximum diameter of the filler. The semiconductor device includes, at an interface between the first insulating resin member and the second insulating resin member, a mixture layer in which these resins are mixed with each other.

20 Claims, 24 Drawing Sheets

(51) Int. Cl.
*H01L 23/495* (2006.01)
*H01L 23/00* (2006.01)

(52) U.S. Cl.
CPC ........ *H01L 23/49568* (2013.01); *H01L 24/32* (2013.01); *H01L 24/48* (2013.01); *H01L 24/73* (2013.01); *H01L 2224/32175* (2013.01); *H01L 2224/48245* (2013.01); *H01L 2224/73265* (2013.01)

(56) References Cited

U.S. PATENT DOCUMENTS

| | | | |
|---|---|---|---|
| 2002/0109211 A1* | 8/2002 | Shinohara | H01L 23/49575 257/666 |
| 2002/0149090 A1 | 10/2002 | Ikenaga et al. | |
| 2002/0153596 A1 | 10/2002 | Tsubosaki et al. | |
| 2005/0067719 A1 | 3/2005 | Hayashi et al. | |
| 2005/0082690 A1 | 4/2005 | Hayashi et al. | |
| 2006/0022331 A1 | 2/2006 | Shinohara | |
| 2006/0027900 A1 | 2/2006 | Takeuchi et al. | |
| 2006/0054901 A1* | 3/2006 | Shoji | H01L 25/167 257/80 |
| 2008/0185697 A1* | 8/2008 | Chiou | H01L 23/3135 257/676 |
| 2010/0320579 A1 | 12/2010 | Abbott | |
| 2011/0140253 A1 | 6/2011 | Lee et al. | |
| 2012/0018906 A1 | 1/2012 | Mino et al. | |
| 2012/0196405 A1 | 8/2012 | Sakamoto et al. | |
| 2014/0015000 A1 | 1/2014 | Nishiyama et al. | |
| 2016/0315054 A1 | 10/2016 | Kajihara et al. | |

FOREIGN PATENT DOCUMENTS

| | | |
|---|---|---|
| EP | 3 128 550 A1 | 2/2017 |
| JP | 2-15738 U | 1/1990 |
| JP | 9-27579 A | 1/1997 |
| JP | 9-102580 A | 4/1997 |
| JP | 2002-237562 A | 8/2002 |
| JP | 2002-299538 A | 10/2002 |
| JP | 2005-109100 A | 4/2005 |
| JP | 2008187045 A | 8/2008 |
| JP | 4220641 B2 | 2/2009 |
| JP | 2009-302526 A | 12/2009 |
| JP | 2010-109246 A | 5/2010 |
| JP | 4463146 B2 | 5/2010 |
| JP | 2012-160517 A | 8/2012 |
| JP | 2015-191979 A | 11/2015 |
| JP | 2016-018904 A | 2/2016 |
| WO | 2015/151273 A1 | 10/2015 |
| WO | 2015151273 A1 | 10/2015 |

OTHER PUBLICATIONS

Japanese Office Action dated May 15, 2018 of the corresponding Japanese Patent Application 2018-503866.
International Search Report for PCT/JP2016/056975 dated May 24, 2016 [PCT/ISA/210].
European Office Action dated Jun. 12, 2020 of European patent application No. 16893404.0.
Communication dated May 14, 2021 from the State Intellectual Property Office of the P.R. of China in Application No. 201680083069.2.
Communication dated Jun. 7, 2019 from the European Patent Office in application No. 16893404.0.
Communication dated Nov. 27, 2020 in European Application No. 16893404.0.
Office Action dated Jan. 6, 2021 in Chinese Application No. 201680083069.2.

* cited by examiner

SEMICONDUCTOR DEVICE AND METHOD FOR MANUFACTURING SEMICONDUCTOR DEVICE

CROSS REFERENCE TO RELATED APPLICATIONS

This application is a National Stage of International Application No. PCT/JP2016/056975 filed Mar. 7, 2016.

TECHNICAL FIELD

The present invention relates to a resin-molded type semiconductor device and a method for manufacturing the semiconductor device. In particular, the present invention relates to a semiconductor device in which a semiconductor element is sealed with an insulating resin and a method for manufacturing the semiconductor device.

BACKGROUND ART

In a semiconductor device, after a semiconductor element such as an IGBT (Insulated Gate Bipolar Transistor), a MOSFET (Metal-Oxide-Semiconductor Field-Effect Transistor), an IC (Integrated Circuit) chip, or an LSI (Large Scale Integrated Circuit) chip is die-bonded to a lead frame for an external terminal, an electrode of the semiconductor element is electrically connected to the external terminal by means of a wire or an inner lead, thereby enabling input/output of signals from/to the outside.

In a resin-molded type semiconductor device, a surface (mounting surface) of a lead frame, on which a semiconductor element is mounted, and a heat dissipating surface opposite to the mounting surface, are sealed with an insulating resin by transfer molding. In particular, since a power semiconductor device has therein a high-heat generating semiconductor element, high thermal conductivity is required of the insulating resin used for the sealing.

A conventional semiconductor device of this type includes: a frame including a die pad having a front surface and a rear surface; a power chip disposed on the front surface of the die pad; an insulating resin sheet that has a first surface and a second surface opposed to each other, and is disposed such that the first surface is in contact with the rear surface of the die pad; and an insulating resin disposed on the first surface of the resin sheet so as to seal the power chip. Since the resin sheet is used, a semiconductor device having excellent heat dissipation can be obtained, and size reduction of the semiconductor device can be achieved (refer to Patent Document 1).

In a conventional method for manufacturing a semiconductor device of this type, thermal conductivity of a second mold resin for sealing a power semiconductor element chip is made higher than that of a first mold resin for sealing a control IC chip, whereby heat generated from the power semiconductor element chip in which a large current flows is effectively dissipated from the second mold resin having the high thermal conductivity (refer to Patent Document 2).

CITATION LIST

Patent Document

Patent Document 1: Japanese Laid-Open Patent Publication No. 2005-109100
Patent Document 2: Japanese Patent No. 4463146

SUMMARY OF THE INVENTION

Problems to be Solved by the Invention

In Patent Document 1 described above, since the insulating resin sheet of which thickness can be prescribed in advance is used, control can be performed so as to achieve both insulation and heat dissipation by adjusting the thickness of the resin sheet.

However, in order to prevent chipping or cracking of the resin sheet during manufacture and transportation thereof, rigidity of the resin sheet needs to be increased, and therefore the resin sheet needs to have a certain thickness. In particular, in a case where a filler having good thermal conductivity is contained in the resin sheet, the thickness of the resin sheet has to be about 3 times the maximum diameter of the filler. In addition, in order to increase the rigidity of the resin sheet in transportation or handling, the resin sheet needs to be attached to a metal plate such as a copper foil.

In Patent Document 2 described above, the second mold resin is molded through a resin injection process (transfer molding process). Also in this case, if a filler having good thermal conductivity is contained in the second mold resin, the thickness of the second mold resin has to be about 3 times the maximum diameter of the filler.

The present invention has been made to solve the above problem, and an object of the present invention is to provide a semiconductor device and a manufacturing method thereof in which a mounting surface of a lead frame and a heat dissipating surface, of the lead frame, opposite to the mounting surface are molded by using a resin sheet, and which are able to improve heat dissipation by making the thickness of an insulating resin member formed of the resin sheet smaller than that of the conventional semiconductor device.

Solution to the Problems

A semiconductor device according to the present invention includes: a lead frame on which a semiconductor element is mounted; a first insulating resin member sealing a mounting surface, of the lead frame, on which the semiconductor element is mounted; and a second insulating resin member sealing a heat dissipating surface, of the lead frame, opposite to the mounting surface. The second insulating resin member contains a filler having a maximum diameter of 0.02 mm to 0.075 mm. The second insulating resin member includes a thin molded portion formed in contact with the heat dissipating surface of the lead frame, and the thin molded portion has a thickness 1.1 times to 2 times the maximum diameter of the filler. The semiconductor device includes, at an interface between the first insulating resin member and the second insulating resin member, a mixture layer in which these resins are mixed with each other.

A method for manufacturing a semiconductor device according to the present invention includes: molding a powder-like second insulating resin into a sheet-like second insulating resin by using a resin molder; transferring the sheet-like second insulating resin to a position above a lower die while being disposed on the resin molder, and placing the sheet-like second insulating resin on the lower die; disposing a lead frame on which a semiconductor element is mounted, on the sheet-like second insulating resin disposed on the lower die; and mounting an upper die to the lower die, and performing transfer molding to form a first insulating resin member sealing a mounting surface, of the lead frame, on which the semiconductor element is mounted, and a second insulating resin member sealing a heat dissipating surface, of the lead frame, opposite to the mounting surface.

A method for manufacturing a semiconductor device according to the present invention, includes: molding a powder-like second insulating resin into a sheet-like second insulating resin on a heat sink by using a resin molder; transferring the sheet-like second insulating resin molded on the heat sink to a position above a lower die while being disposed on the resin molder together with the heat sink, and placing the sheet-like second insulating resin and the heat sink on the lower die; disposing a lead frame on which a semiconductor element is mounted, on the sheet-like second insulating resin and the heat sink disposed on the lower die; and mounting an upper die to the lower die, and performing transfer molding, thereby forming a first insulating resin member sealing a mounting surface, of the lead frame, on which the semiconductor element is mounted, and a second insulating resin member sealing a heat dissipating surface, of the lead frame, opposite to the mounting surface, and joining the heat sink to the second insulating resin member.

Effect of the Invention

According to the present invention, in a semiconductor device including a first insulating resin member sealing a mounting surface, of the lead frame, on which the semiconductor element is mounted, and a second insulating resin member sealing a heat dissipating surface, of the lead frame, opposite to the mounting surface, the thickness of a thin molded portion formed in contact with the heat dissipating surface of the lead frame of the second insulating resin member can be reduced as compared to that of the conventional device, thereby improving heat dissipation.

DESCRIPTION OF EMBODIMENTS

Embodiment 1

Figure 1:
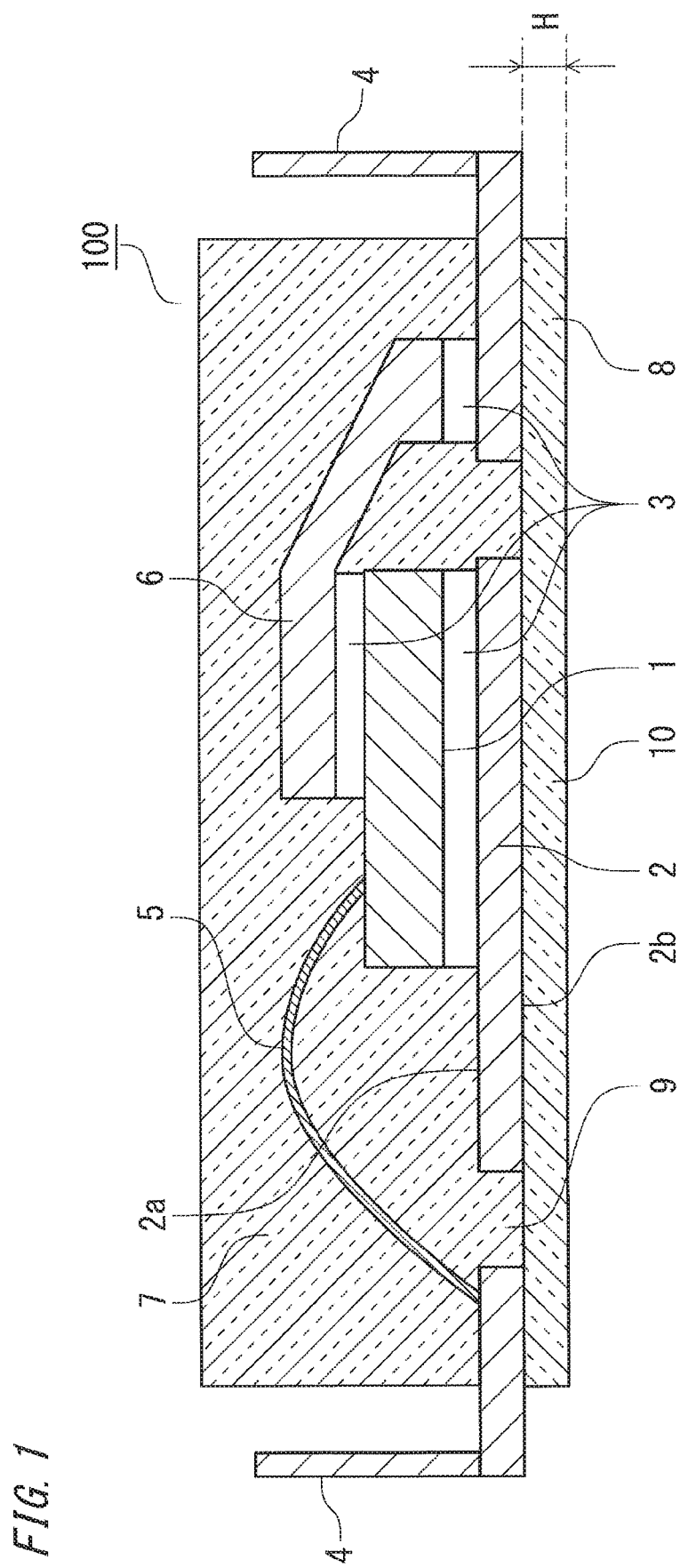
FIG. 1 is a cross-sectional view showing a semiconductor device according to Embodiment 1 of the present invention.

Hereinafter, a semiconductor device according to Embodiment 1 of the present invention will be described based on the drawings. FIG. 1 is a cross-sectional view showing the configuration of the semiconductor device according to Embodiment 1.

As shown in FIG. 1, the semiconductor device 100 according to Embodiment 1 includes a semiconductor element 1, a lead frame 2, an external terminal 4, a wire 5, an inner lead 6, a first insulating resin member 7, and a second insulating resin member 8. In FIG. 1, the semiconductor element 1 such as an IGBT, a MOSFET, an IC chip, or an LSI chip is mounted on an upper surface (hereinafter referred to as "mounting surface 2a"), in FIG. 1, of the lead frame 2 via a joining member 3 such as solder or silver. The lead frame 2 is formed of a copper plate, a copper alloy plate, or the like. The surface of the lead frame 2 is coated with metal plating (not shown) of gold, silver, nickel, tin, or the like.

An electrode pad of the semiconductor element 1 is electrically connected to the external terminal 4 via the wire 5 connected by wire bonding or via the inner lead 6 made of a material such as a copper plate or a copper alloy plate, whereby the semiconductor element 1 performs input/output of signals from/to external equipment via the external terminal 4. The wire 5 and the inner lead 6 are transposable with each other. The wire 5 is made of gold, silver, aluminum, copper, or the like, and the diameter of the wire 5 is about 20 µm to 500 µm.

The first insulating resin member 7 made of a first insulating resin is formed on the mounting surface 2a side of the lead frame 2. The second insulating resin member 8 made of a second insulating resin is formed on a heat dissipating surface 2b side, of the lead frame 2, opposite to the mounting surface 2a. In Embodiment 1, a space (hereinafter referred to as "die pad space 9") between two separated portions of the lead frame 2 is filled with the first insulating resin to become the first insulating resin member 7.

The second insulating resin member 8 has a thin molded portion 10 formed in contact with the heat dissipating surface 2b of the lead frame 2. The thin molded portion 10 has a thickness H of about 0.022 mm to 0.15 mm, and is formed of the second insulating resin. The thin molded portion 10 is joined to a heat sink (not shown) made of copper, aluminum, or the like via a heat dissipating member such as grease.

Both the resins forming the first insulating resin member 7 and the second insulating resin member 8 are thermosetting epoxy resins or the like. However, a resin used for the second insulating resin member 8 on the heat dissipating surface 2b side of the lead frame 2 has higher thermal conductivity than a resin used for the first insulating resin member 7 on the mounting surface 2a side of the lead frame 2. As described later, the second insulating resin forming the second insulating resin member 8 contains a filler 18 having good thermal conductivity, such as silica, alumina, boron nitride, or aluminum nitride. The thermal conductivity of the second insulating resin member 8 is 3 W/m·K to 12 W/m·K. As for the first insulating resin member 7 on the mounting surface 2a side, a low-stress resin having good fluidity, which is used for general semiconductor devices, is used. For example, a low-stress resin obtained by adding silicone in a thermosetting epoxy resin or the like, or a low-stress resin of which thermal expansion coefficient is approximated to that of the lead frame, is used.

Next, a method for manufacturing the semiconductor device according to Embodiment 1 will be described with reference to FIG. 2 to FIG. 7.

Figure 2:
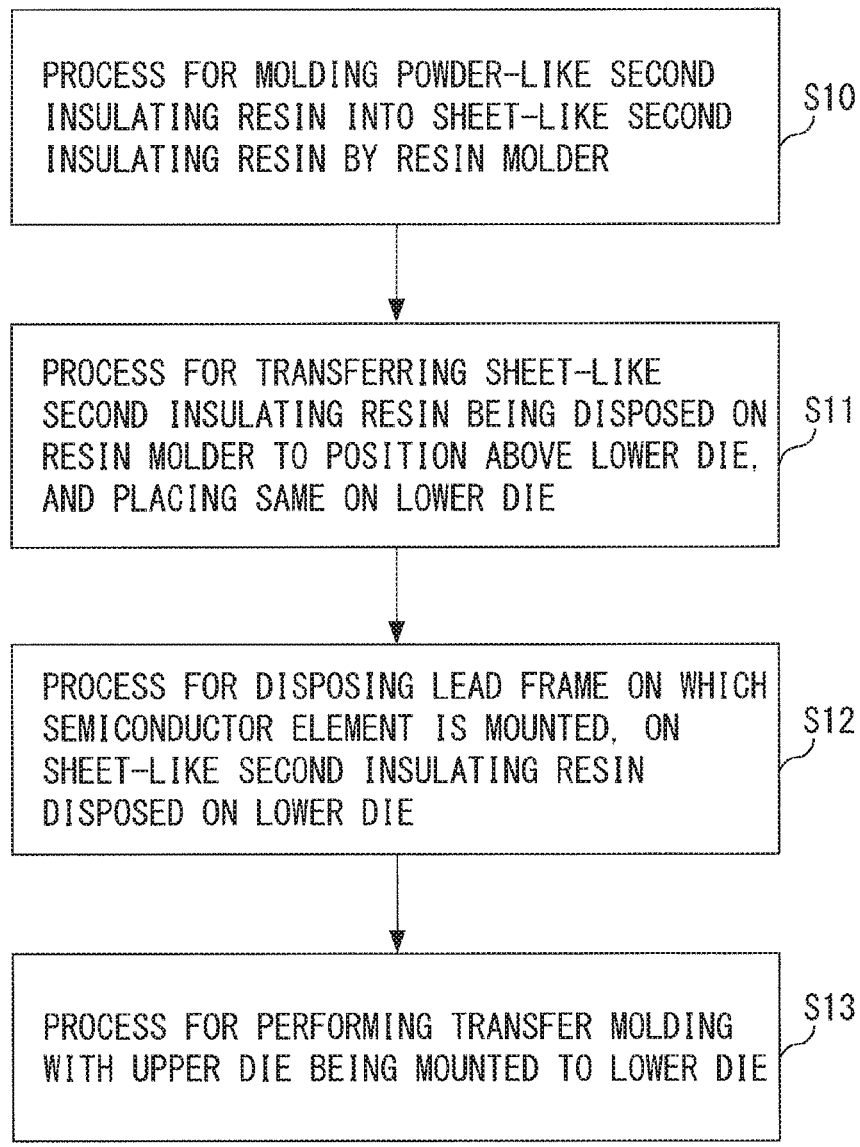
FIG. 2 is a flowchart showing a method for manufacturing the semiconductor device according to Embodiment 1 of the present invention.
Figure 3:
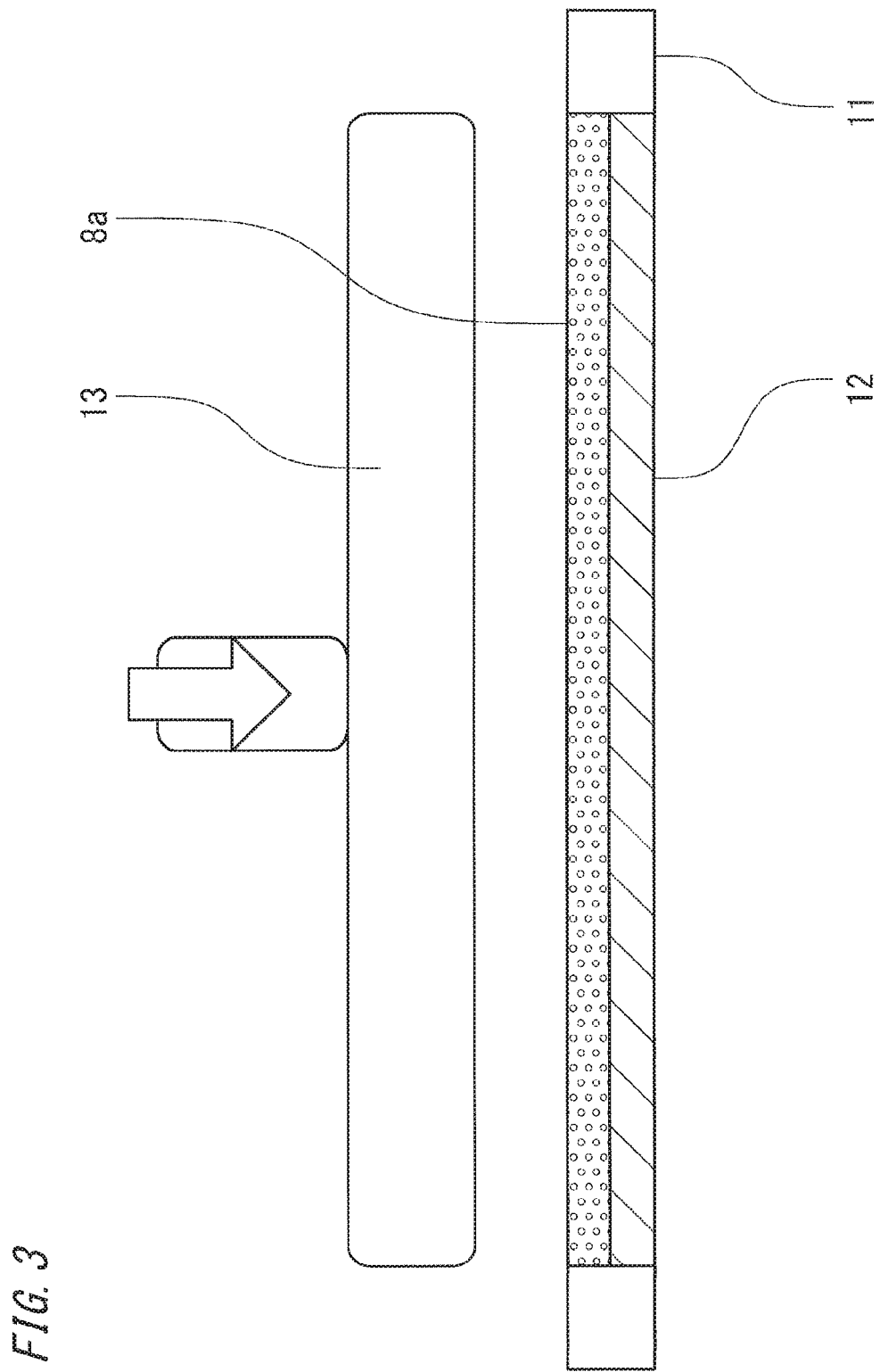
FIG. 3 is a cross-sectional view showing a process for manufacturing the semiconductor device according to Embodiment 1 of the present invention.
Figure 4:
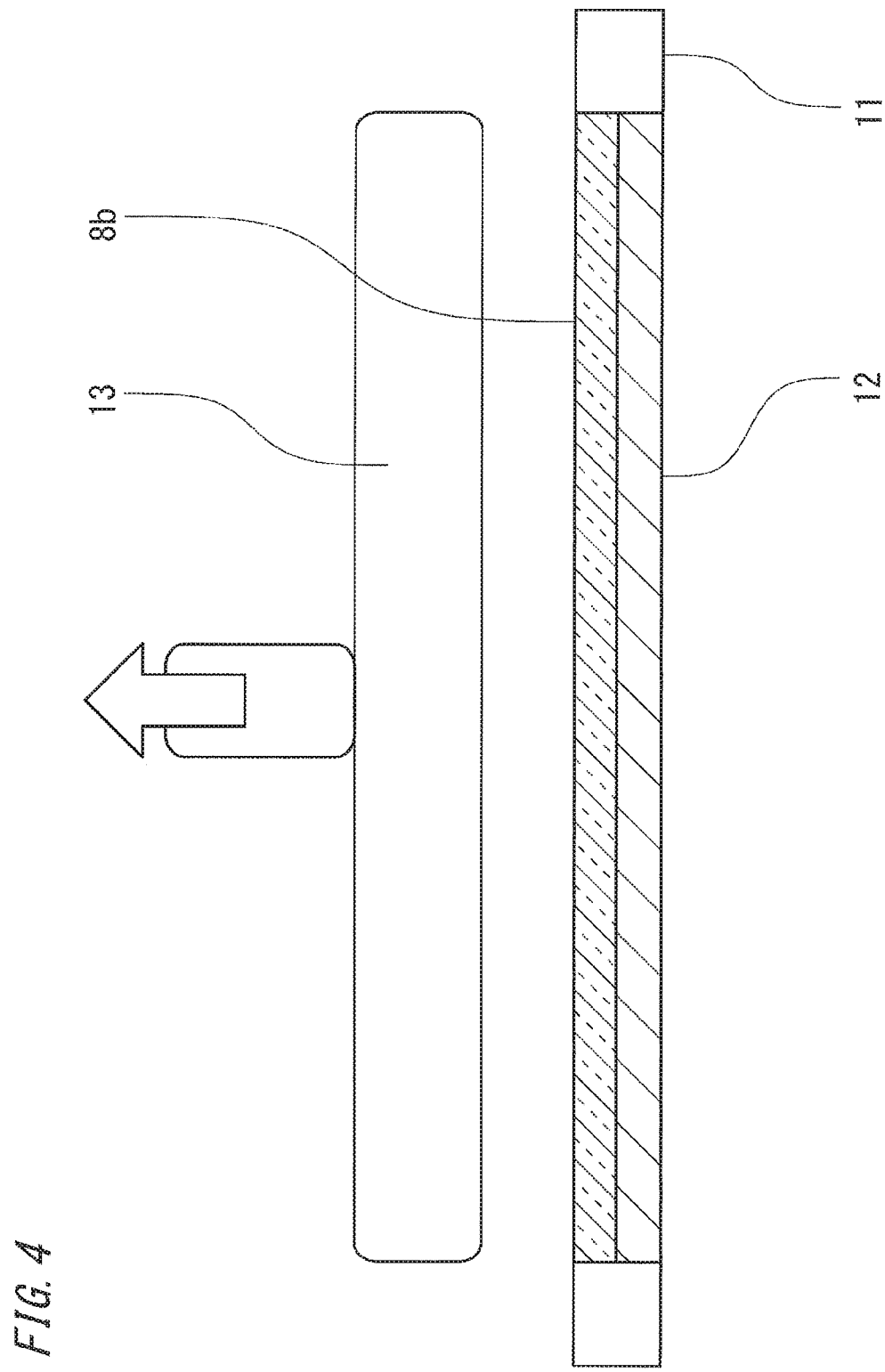
FIG. 4 is a cross-sectional view showing the process for manufacturing the semiconductor device according to Embodiment 1 of the present invention.
Figure 5:
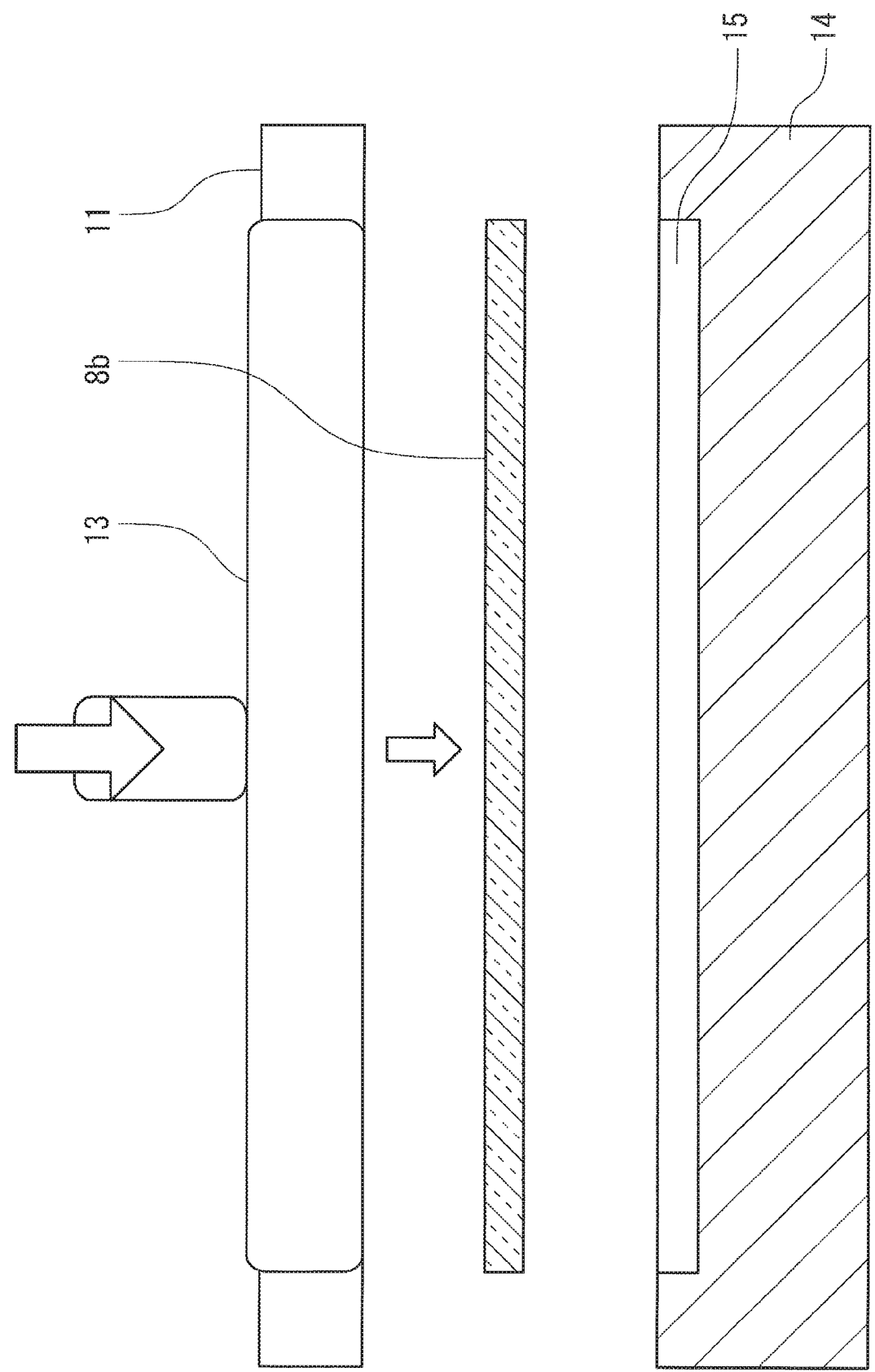
FIG. 5 is a cross-sectional view showing the process for manufacturing the semiconductor device according to Embodiment 1 of the present invention.
Figure 6:
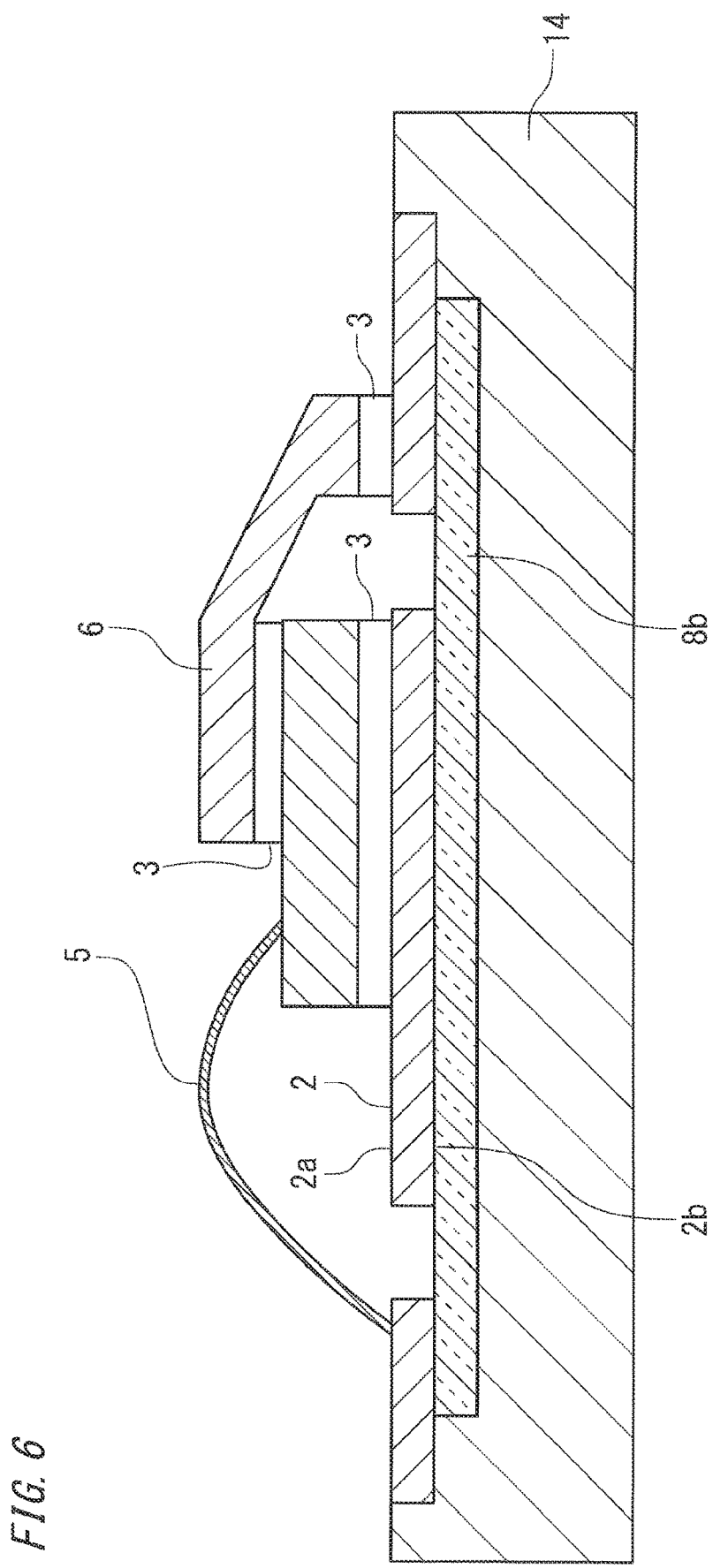
FIG. 6 is a cross-sectional view showing the process for manufacturing the semiconductor device according to Embodiment 1 of the present invention.
Figure 7:
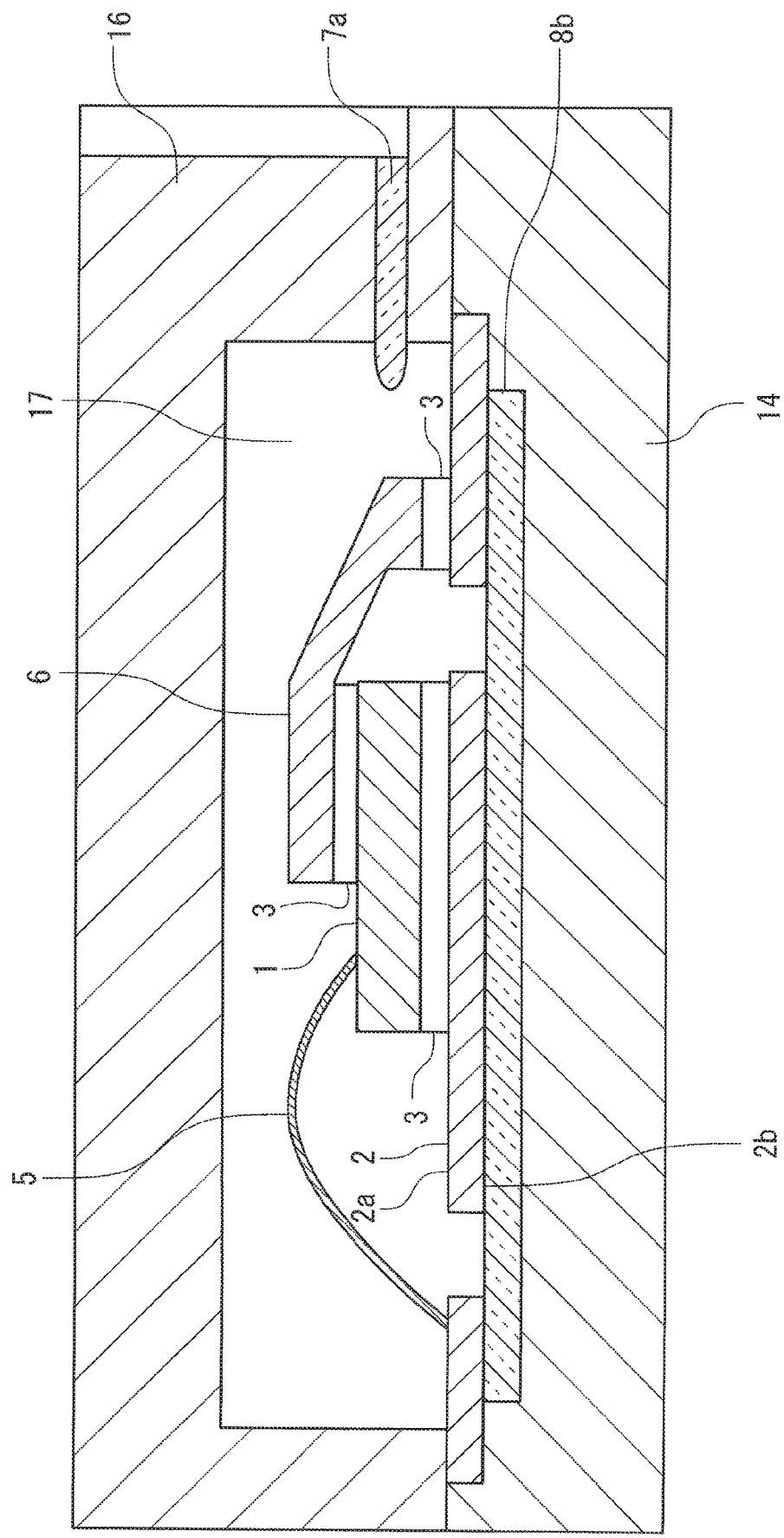
FIG. 7 is a cross-sectional view showing the process for manufacturing the semiconductor device according to Embodiment 1 of the present invention.

FIG. 2 is a flowchart showing process steps for manufacturing the semiconductor device 100 of Embodiment 1. FIG. 3 is a cross-sectional view of a resin molder 11 for forming a powder-like second insulating resin 8a into a sheet-like second insulating resin 8b having a desired shape. FIG. 3 also shows a punch 13 for compressing the powder-like second insulating resin 8a into the sheet-like second insulating resin 8b. FIG. 4 is a cross-sectional view of the resin molder 11, showing a state in which the powder-like second insulating resin 8a is compressed by the punch 13 and formed into the sheet-like second insulating resin 8b. FIG. 5 is a cross-sectional view showing a state in which the sheet-like second insulating resin 8b on the resin molder 11 is pushed by the punch 13, and dropped on a lower-die cavity 15 of a lower die 14 of a transfer molding die to be fitted in the lower-die cavity 15. FIG. 6 is a cross-sectional view showing a state in which the sheet-like second insulating resin 8b and the lead frame 2 on which the semiconductor element 1 is mounted are disposed on the lower die 14. FIG. 7 is a cross-sectional view showing a state in which the lead frame 2 on which the sheet-like second insulating resin 8b and the semiconductor element 1 are mounted is disposed on the transfer molding die, and transfer molding is performed.

The method for manufacturing the semiconductor device 100 according to Embodiment 1 will be described in more detail.

FIG. 3 and FIG. 4 are diagrams for explaining "Process for molding powder-like second insulating resin into sheet-like second insulating resin by resin molder" in step S10 shown in FIG. 2. In FIG. 3, the resin molder 11 is a means for forming the powder-like second insulating resin 8a into the sheet-like second insulating resin 8b, and includes a base part 12. Then, the powder-like second insulating resin 8a is sprayed on the base part 12 of the resin molder 11. Thereafter, the punch 13 is moved down toward the powder-like second insulating resin 8a sprayed on the base part 12, and compressivey molds the powder-like second insulating resin 8a into the sheet-like second insulating resin 8b having a desired shape. After the powder-like second insulating resin 8a has been compressed and formed into the sheet-like second insulating resin 8b by the punch 13, the punch 13 is temporarily moved upward as shown in FIG. 4.

FIG. 5 is a diagram for explaining "Process for transferring sheet-like second insulating resin being disposed on resin molder to position above lower die, and placing same on lower die" in step S11 shown in FIG. 2. In FIG. 5, first, the sheet-like second insulating resin 8b is transferred to a position above the lower die 14 of the transfer molding die while being disposed on the resin molder 11. When the sheet-like second insulating resin 8b has reached the position above the lower-die cavity 15 of the lower die 14, the base part 12 beneath the sheet-like second insulating resin 8b is removed. Then, the punch 13 is again moved downward, whereby the sheet-like second insulating resin 8b is fitted in the lower-die cavity 15.

FIG. 6 is a diagram for explaining "Process for disposing lead frame on which semiconductor element is mounted, on sheet-like second insulating resin disposed on lower die" in step S12 shown in FIG. 2. In FIG. 6, on the sheet-like second insulating resin 8b disposed on the lower die 14, the lead frame 2 on which the semiconductor element 1 is mounted is disposed such that the second insulating resin 8b faces the heat dissipating surface 2b of the lead frame 2. At this time, whether the sheet-like second insulating resin 8b and the lead frame 2 are in contact with each other is optional.

FIG. 7 is a diagram for explaining "Process for performing transfer molding with upper die being mounted to lower die" in step S13 shown in FIG. 2. In FIG. 7, in the state where the sheet-like second insulating resin 8b and the lead frame 2 on which the semiconductor element 1 is mounted are disposed on the lower die 14, an upper die 16 of the transfer molding die is mounted, followed by transfer molding. A first insulating resin 7a is melted by heat and pressure applied thereto in the lower die 14 and the upper die 16 for transfer molding, passes through a gate, and is injected into an upper-die cavity 17, whereby the first insulating resin member 7 is formed on the mounting surface 2a of the lead frame 2. At the same time, the sheet-like second insulating resin 8b is melted by heat and pressure applied thereto in the lower die 14 and the upper die 16, and adheres to the lead frame 2 and the first insulating resin 7a, whereby the second insulating resin member 8 is formed on the heat dissipating surface 2b of the lead frame 2. At this time, since the first insulating resin 7a and the sheet-like second insulating resin 8b are simultaneously melted, the two types of resins are mixed with each other at the contact portions thereof. As a result, at the interface between the first insulating resin member 7 and the first insulating resin member 8, a mixture layer in which these resins are mixed with each other is formed.

As described above, the first insulating resin member 7 and the second insulating resin member 8 are formed on the mounting surface 2a and the heat dissipating surface 2b of the lead frame 2, respectively, through single transfer molding, thereby completing the transfer molding process.

Figure 8:
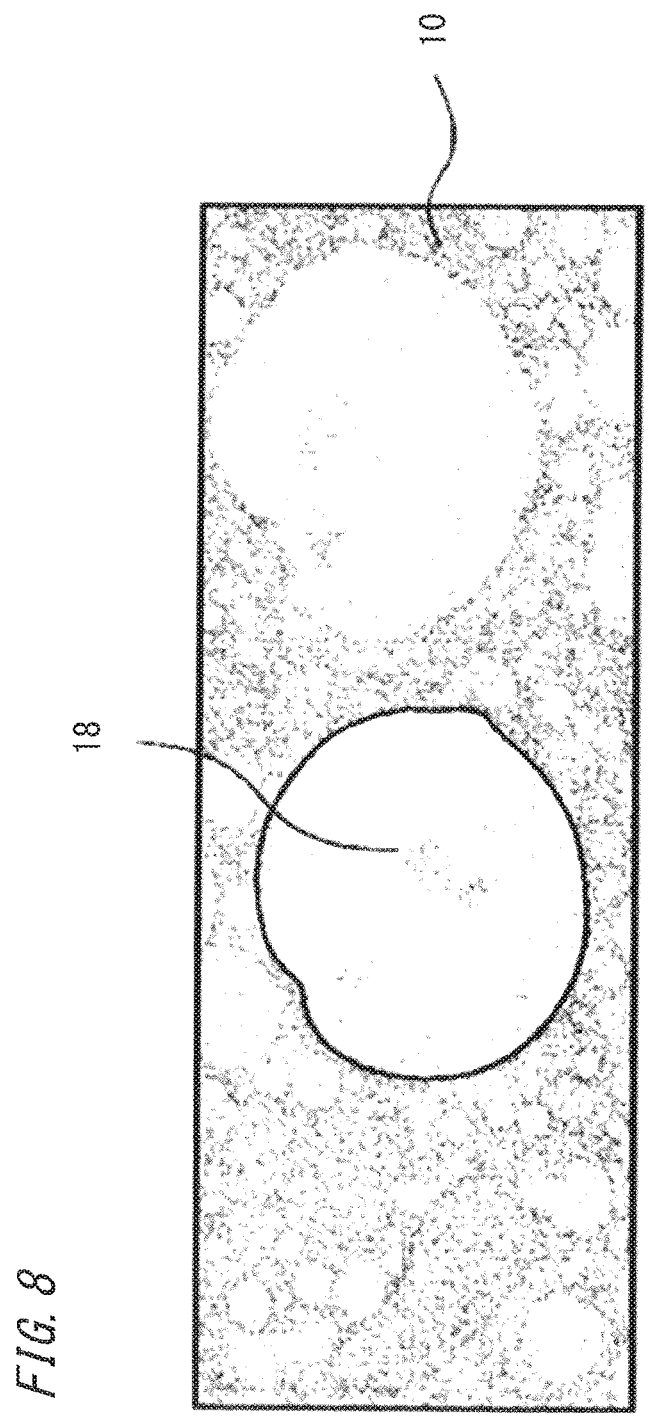
FIG. 8 is a partial cross-sectional view showing a thin molded portion of the semiconductor device according to Embodiment 1 of the present invention.

FIG. 8 is an enlarged cross-sectional view showing the thin molded portion 10 of the semiconductor device 100 after the transfer molding. As for the sheet-like second insulating resin 8b forming the second insulating resin member 8, an insulating resin such as an epoxy resin containing the heat conductive filler 18 such as silica, alumina, boron nitride, or aluminum nitride is used. The maximum filler diameter (filler cut point) of the filler 18 is 0.02 mm to 0.75 mm, and the thickness H of the thin molded portion 10 after the transfer molding is 0.022 mm to 0.15 mm which is 1.1 times to 2 times the maximum filler diameter.

As described above, according to Embodiment 1, the powder-like second insulating resin is molded into the sheet-like second insulating resin by the resin molder. The sheet-like second insulating resin is transferred to the position above the lower die while being disposed on the resin molder, and is placed on the lower die. The lead frame on which the semiconductor element is mounted is disposed on the sheet-like second insulating resin disposed on the lower die. The upper die is mounted to the lower die, followed by transfer molding, thereby forming the first insulating resin member sealing the mounting surface that is a surface, of the lead frame, on which the semiconductor element is mounted, and the second insulating resin member sealing the heat dissipating surface that is a surface, of the lead frame, opposite to the mounting surface. Therefore, even when the thickness of the sheet-like second insulating resin is reduced such that the thickness of the thin molded portion 10 after the transfer molding becomes 0.022 mm to 0.15 mm, it is possible to obtain a semiconductor device that is not defective as a product, and has heat dissipation superior to that of the conventional semiconductor device.

That is, although the thickness of the sheet-like second insulating resin is as thin as 0.022 mm to 0.15 mm and therefore the rigidity thereof is low, since the sheet-like second insulating resin is transferred to the lower die while being disposed on the resin molder, chipping or cracking due to transportation can be avoided. In the conventional semiconductor device, in order to increase the rigidity of the sheet-like second insulating resin in manufacture or transportation, the sheet-like second insulating resin needs to be attached to a metal plate such as a copper foil. However, in the semiconductor device of Embodiment 1, such a metal plate can be omitted, resulting in cost reduction and increase in insulation. Furthermore, even if chipping or cracking occurs during manufacture and/or transportation of the sheet-like second insulating resin, since the sheet-like second insulating resin is transferred to the lower die while being disposed on the resin molder, the volume required for forming the thin molded portion is disposed on the lower die. In the transfer molding process, the sheet-like second insulating resin is melted and flows, chipping and/or cracking can be compensated for by the flowing resin. Therefore, the semiconductor device is not defective as a product, and productivity is improved.

Since the first insulating resin is formed on the mounting surface of the lead frame through the transfer molding process with the sheet-like second insulating resin being disposed on the heat dissipating surface of the lead frame, fluidity of the sheet-like second insulating resin is improved, and the sheet-like second insulating resin easily becomes wettable with respect to the lead frame, thereby improving adhesion between the thin molded portion and the lead frame.

Since the first insulating resin and the sheet-like second insulating resin are simultaneously melted, the mixture layer in which the first insulating resin member and the second insulating resin member are mixed with each other is formed at the interface between these resins, thereby improving adhesion between the first insulating resin member and the second insulating resin member.

As described above, a highly-reliable semiconductor device having high productivity and excellent heat dissipation and insulation can be inexpensively obtained, in which adhesion between the first insulating resin member and the second insulating resin member is improved, adhesion between the lead frame and the second insulating resin member is improved, and detachment and cracking of the thin molded portion are not likely to occur.

While in Embodiment 1 the surface of the lead frame 2 is coated with metal plating of gold, silver, nickel, tin, or the like, it is possible that the surface of the lead frame 2 is not coated. While in Embodiment 1 the lead frame 2 having uniform thickness is used, a lead frame having a partially varying thickness may be used. While in Embodiment 1 the heat sink is joined to the thin molded portion 10 via the heat dissipating member such as grease, it is possible that the heat dissipating member is not used.

While in Embodiment 1 the resin used for the second insulating resin member 8 on the heat dissipating surface 2b side of the lead frame 2 has higher thermal conductivity than the resin used for the first insulating resin member 7 on the mounting surface 2a side of the lead frame 2, the first insulating resin member 7 on the mounting surface 2a side may have the same thermal conductivity as that of the second insulating resin member 8. For example, a highly heat-conductive region having thermal conductivity of 3 W/m·K to 12 W/m·K, which is used for the second insulating resin member 8, may be used for the first insulating resin member 7. By sealing the periphery of the semiconductor element 1 as a heat-generating component with the highly heat-conductive resin, heat is dissipated from the entire periphery of the semiconductor element 1, thereby improving heat dissipation.

Embodiment 2

Figure 9:
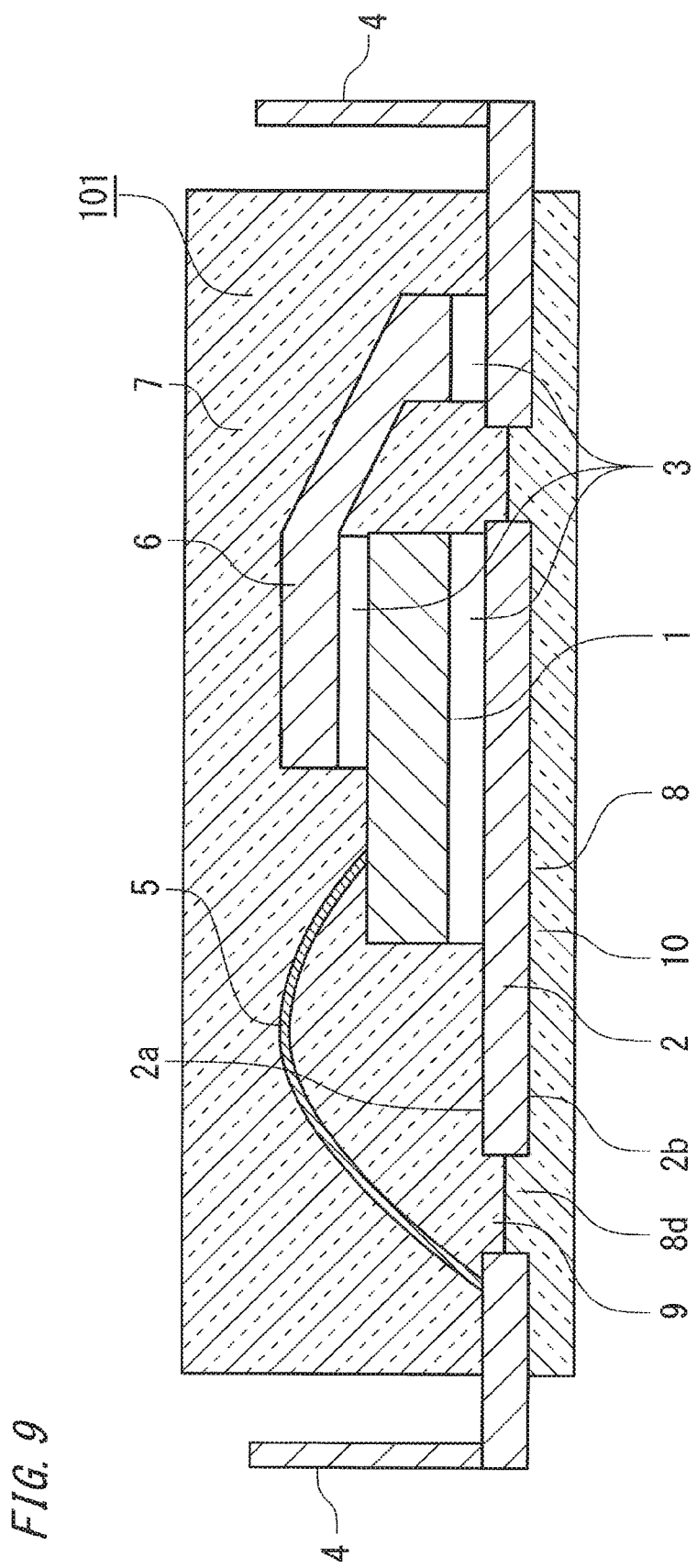
FIG. 9 is a cross-sectional view showing a semiconductor device according to Embodiment 2 of the present invention.

FIG. 9 is a cross-sectional view showing a configuration of a semiconductor device according to Embodiment 2 of the present invention. The semiconductor device 101 according to Embodiment 2 is a modification of the semiconductor device 100 according to Embodiment 1, and the overall configuration thereof is similar to that of Embodiment 1. Therefore, only the differences from Embodiment 1 will be described.

In the semiconductor device 100 according to Embodiment 1, the first insulating resin is filled in the die pad space 9 of the lead frame 2, whereby a portion of the first insulating resin member 7 is formed in the space 9. Meanwhile, in the semiconductor device 101 according to Embodiment 2, a lead frame space filled portion 8d formed of the second insulating resin is filled in at least a portion of the die pad space 9 of the lead frame 2. That is, in Embodiment 2, the second insulating resin member 8 includes the lead frame space filled portion 8d and the thin molded portion 10.

Since the lead frame space filled portion 8d adheres to the side surface of the lead frame 2, the area over which the second insulating resin member 8 adheres to the lead frame 2 increases. As a result, adhesion between the thin molded portion 10 and the lead frame 2 is improved.

Since the thickness of the second insulating resin member 8 is partially increased owing to the lead frame space filled portion 8d, strength of the thin molded portion 10 is increased, which makes chipping and cracking less likely to occur. Furthermore, heat dissipation is advantageously improved owing to an increase in the area of adhesion between the lead frame 2, which forms a heat dissipation path, and the highly heat-conductive second insulating resin member 8. Furthermore, in Embodiment 2, if the entire side surface of the lead frame 2 is coated with the highly heat-conductive second insulating resin member 8, heat dissipation is further improved.

Figure 10:
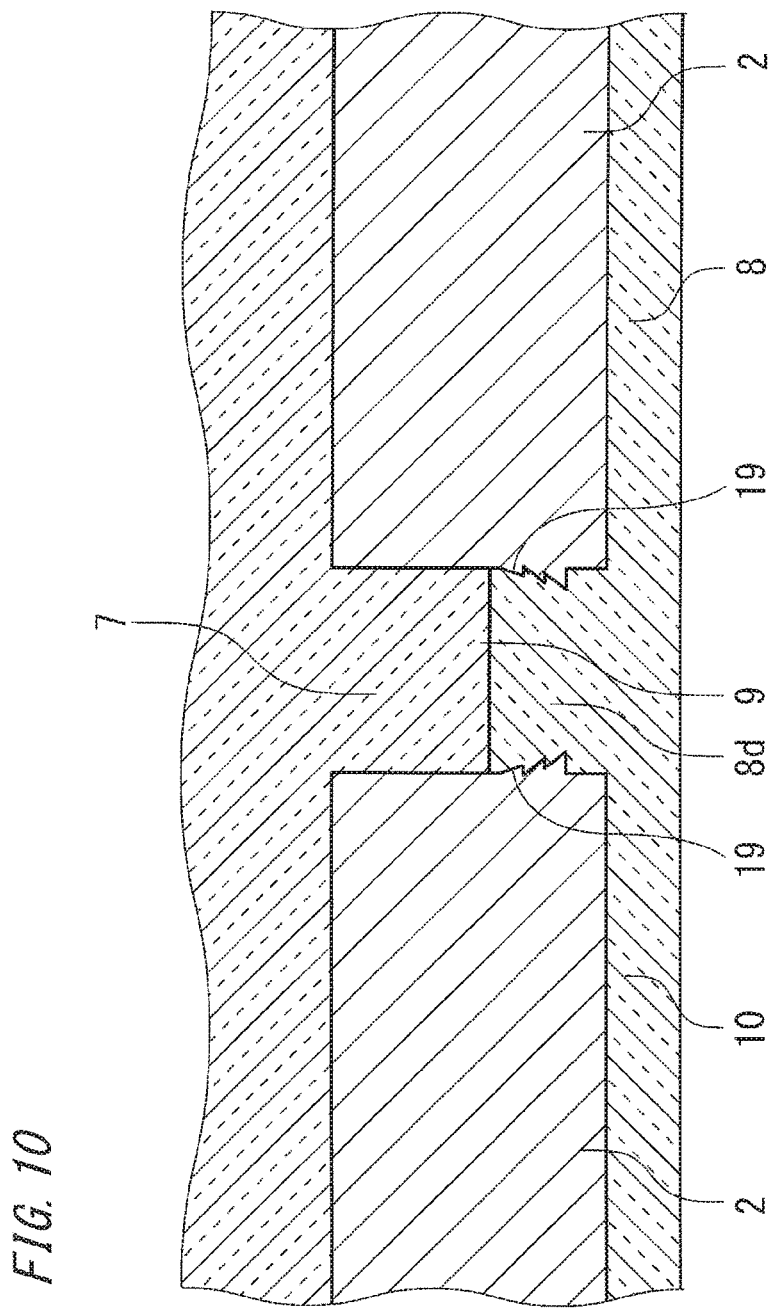
FIG. 10 is a partial cross-sectional view showing the semiconductor device according to Embodiment 2 of the present invention.

As shown in FIG. 10, depressions and projections, in particular, burrs 19, may be formed at a portion of the side surface of the lead frame 2 on which the lead frame space filled portion 8d is disposed. By forming, with a press, the depressions and projections, in particular, the burrs 19, at the side surface of the lead frame 2, adhesion between the lead frame 2 and the lead frame space filled portion 8d is further improved owing to an anchor effect.

The semiconductor device 101 according to Embodiment 2 is manufactured by a manufacturing method including a transfer molding process similar to that described for Embodiment 1. As for the second insulating resin used for the second insulating resin member 8, a resin having lower viscosity and higher fluidity when being melted than the second insulating resin of Embodiment 1 is used. Incidentally, in the transfer molding, the pressure is 8 to 20 MPa, the die temperature is 165° C. to 180° C., and the minimum viscosity of the first insulating resin and the second insulating resin is 10 to 100 Pa-s.

In Embodiment 2, in the transfer molding process, the first insulating resin 7a and the sheet-like second insulating resin 8b are simultaneously melted, and a portion or the whole of the die pad space 9 of the lead frame 2 is filled with the second insulating resin, whereby the lead frame space filled portion 8d and the thin molded portion 10 are formed.

According to Embodiment 2, in addition to the same advantages as in Embodiment 1, adhesion between the thin molded portion and the lead frame is improved because the lead frame space filled portion that is integrally molded with the thin molded portion is formed in at least a portion of the die pad space of the lead frame. Furthermore, since the depressions and projections, in particular, the burrs, are formed at the side surface of the lead frame on which the lead frame space filled portion is disposed, the adhesion is further improved owing to an anchor effect.

Embodiment 3

Figure 11:
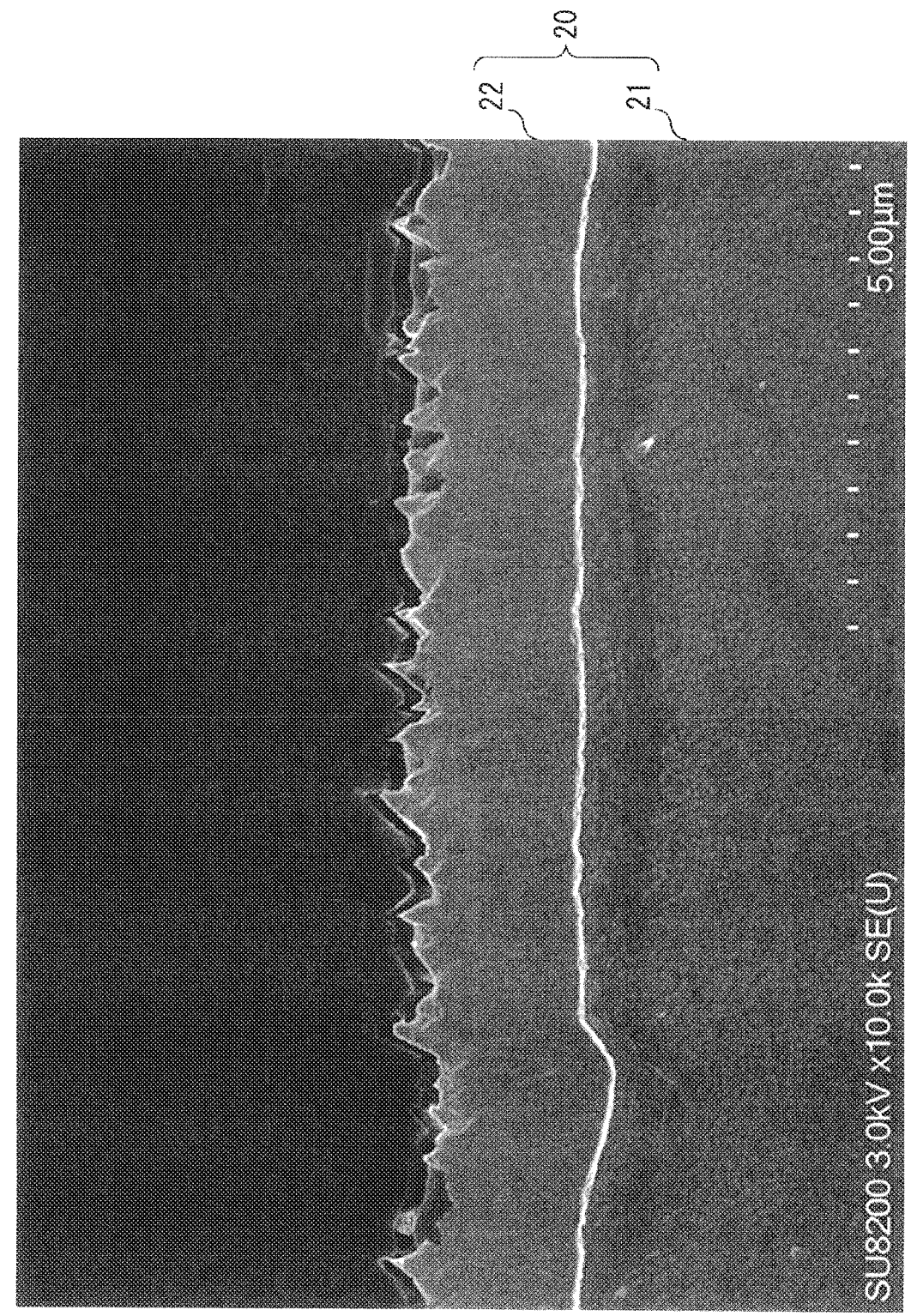
FIG. 11 is a scanning electron micrograph showing a surface state of a lead frame of a semiconductor device according to Embodiment 3 of the present invention.

FIG. 11 is a scanning electron micrograph showing a surface state of a lead frame of a semiconductor device according to Embodiment 3 of the present invention. Since the overall configuration of the semiconductor device according to Embodiment 3 is similar to that of Embodiment 1 or Embodiment 2, only the differences from Embodiment 1 or Embodiment 2 will be described. Since a method for manufacturing the semiconductor device according to Embodiment 3 is similar to that of Embodiment 1, repeated description is not given.

In the semiconductor device according to Embodiment 3, a roughened metal plating lead frame 20 is used instead of the lead frame 2 used in Embodiment 1. The roughened metal plating lead frame 20 is obtained by coating a surface of a lead frame 21 made of copper or a copper alloy with roughened metal plating 22 of nickel, tin, silver, gold, or the like having a surface roughness Ra of about 0.06 to 0.2.

According to Embodiment 3, in addition to the same advantages as in Embodiment 1 or Embodiment 2, adhesion between the lead frame and the first insulating resin member as well as the second insulating resin member is improved owing to an anchor effect of the roughened metal plating since the roughened metal plating lead frame is used. Furthermore, since the surface area of the roughened metal plating lead frame is larger than that of the normal lead frame, heat dissipation is improved.

Embodiment 4

Figure 12:
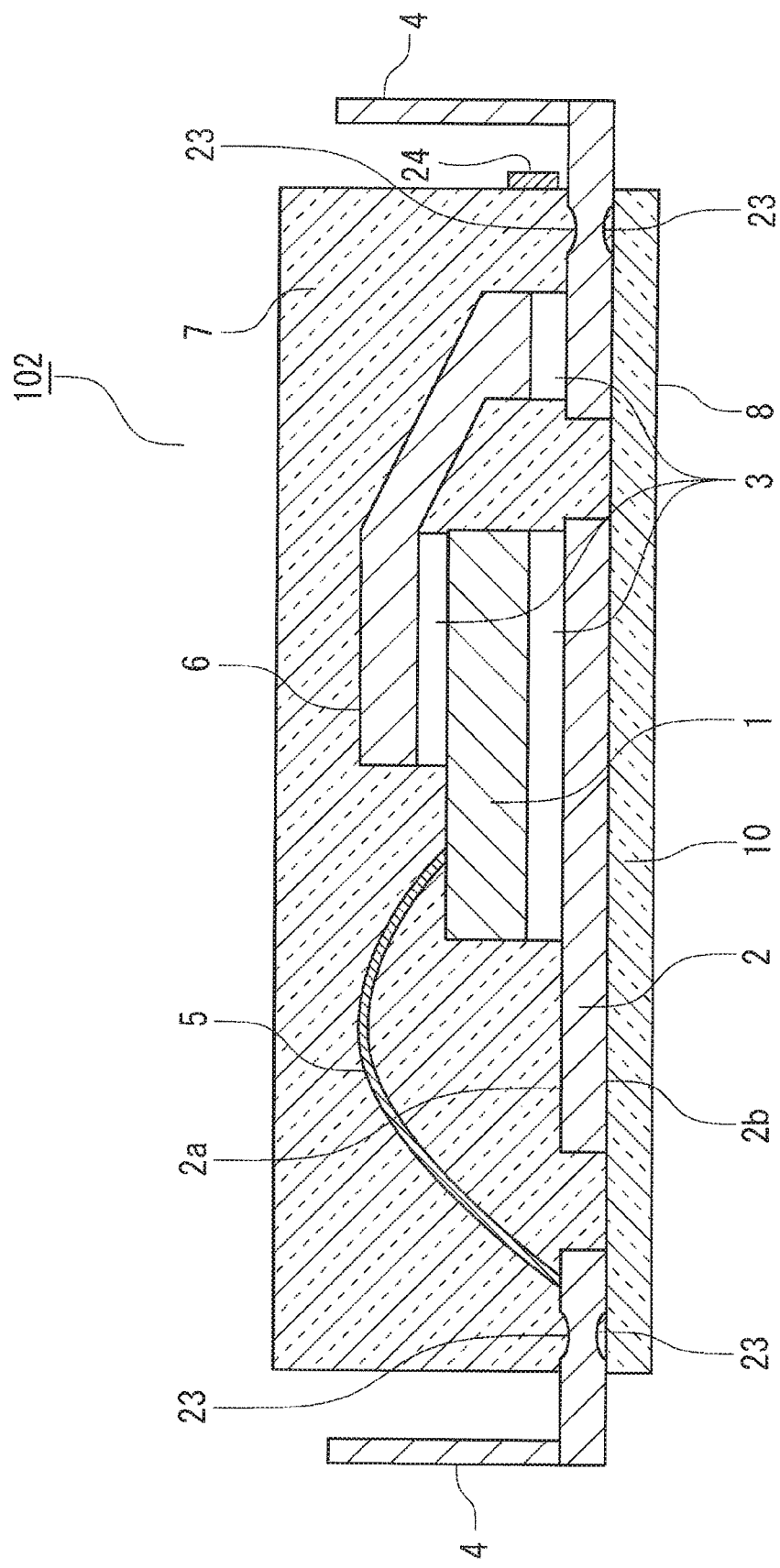
FIG. 12 is a cross-sectional view showing a semiconductor device according to Embodiment 4 of the present invention.

FIG. 12 is a cross-sectional view showing the configuration of a semiconductor device according to Embodiment 4 of the present invention. Since the overall configuration of the semiconductor device 102 according to Embodiment 4 is similar to that of Embodiment 1 or Embodiment 2, only the differences from Embodiment 1 or Embodiment 2 will be described. Since a method for manufacturing the semiconductor device 102 according to Embodiment 4 is similar to that of Embodiment 1, repeated description is not given.

The lead frame 2 of the semiconductor device 102 is coated with metal plating (not shown), and has a scale-like portion 23 obtained by distorting the surface of the metal plating into a scale-like form. In the example shown in FIG. 12, the scale-like portion 23 is disposed at outer peripheral portions of the mounting surface 2a and the heat dissipating surface 2b of the lead frame 2. Detachment of the first insulating resin member 7 and the second insulating resin member 8 from the lead frame 2 is inhibited by an anchor effect of the scale-like portion 23.

Figure 13:
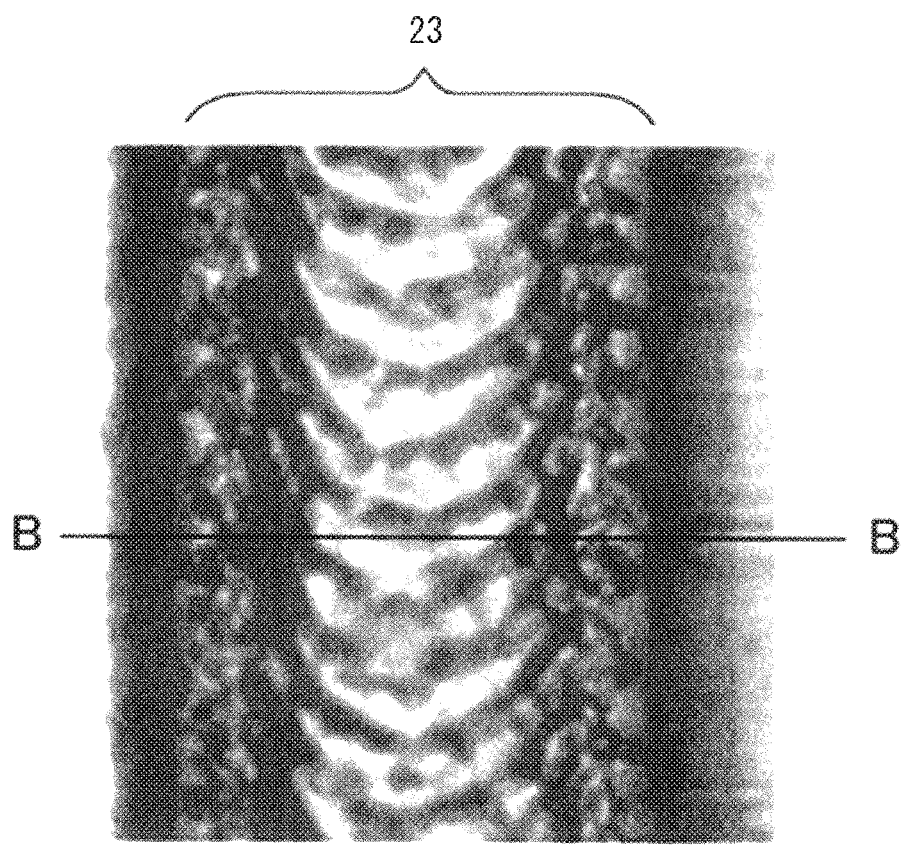
FIG. 13 is a scanning electron micrograph showing the state of a scale-like portion in the semiconductor device according to Embodiment 4 of the present invention.
Figure 14:
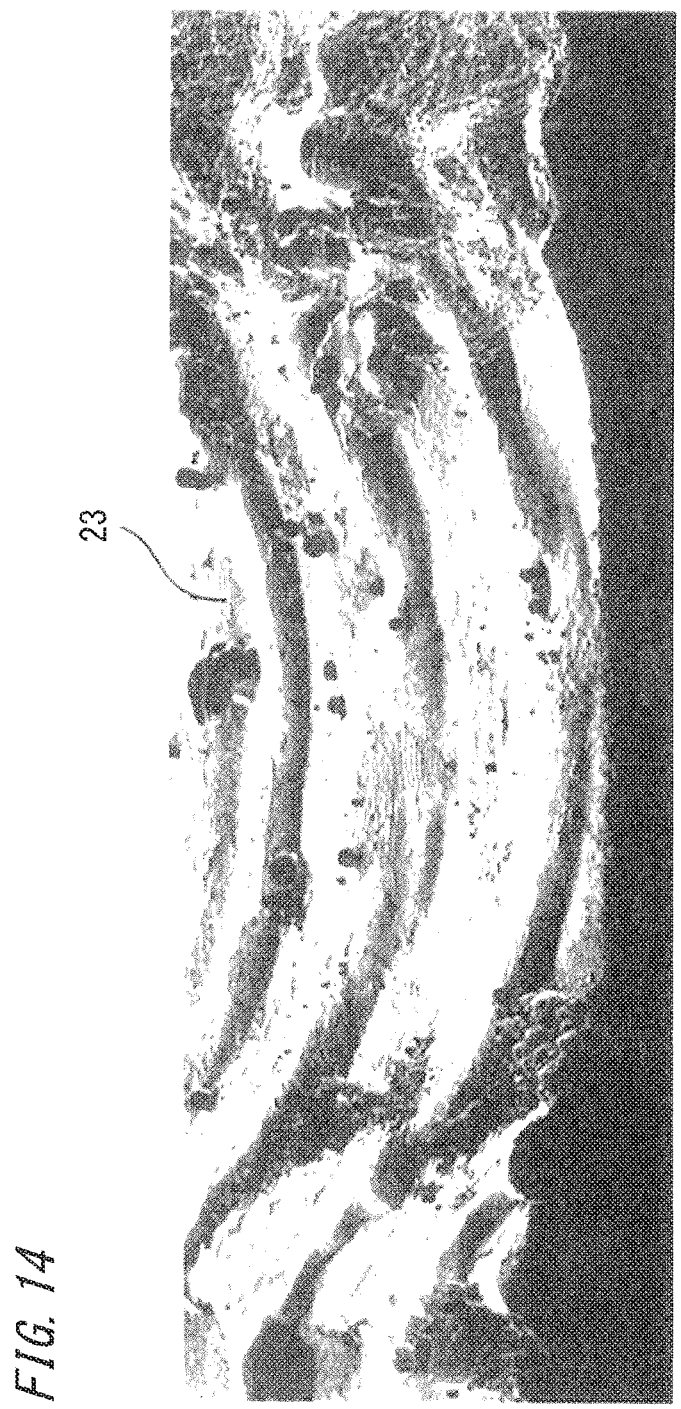
FIG. 14 is a scanning electron micrograph showing the state of the scale-like portion in the semiconductor device according to Embodiment 4 of the present invention.

FIG. 13 and FIG. 14 are scanning electron micrographs showing an aspect of the scale-like portion 23. FIG. 13 is the scanning electron micrograph of the upper surface of the scale-like portion 23, and FIG. 14 is an upper perspective view of a cross-section taken along B-B line in FIG. 13. The scale-like portion 23 is formed as follows. That is, the metal plating coating the lead frame 2 is melted by continuously performing spot irradiation using, for example, a laser, and distorted into a scale form. The scale-like portion 23 includes scale-like projections being continuously disposed, and both sides thereof are raised high.

Since the scale-like portion 23 is formed by laser irradiation, the scale-like portion 23 can be disposed at any position in the lead frame 2. For example, the scale-like portion can be selectively disposed at a position where stress is applied and initial detachment is likely to occur when the semiconductor device is ejected from the molding die or when a gate break is implemented, or a position where adhesion with the first insulating resin member 7 or the second insulating resin member 8 is low. The width and the height of the scale-like portion 23 can be adjusted based on laser output, scanning speed, or the like. The width of the scale-like portion 23 (the width of the scale-like portion 23 shown in FIG. 13) is desirably 60 μm or more, and adhesion is further improved by increasing the width in accordance with the area of the position where the scale-like portion 23 is disposed.

Examples of places where the scale-like portion 23 is disposed in the lead frame 2, and advantages thereof, will be described with reference to FIG. 15, FIG. 16, and FIG. 17. Each figure is a top view of the lead frame 2, and the shape of the top surface of the lead frame 2 is assumed to be a rectangle, for simplification.

Figure 15:
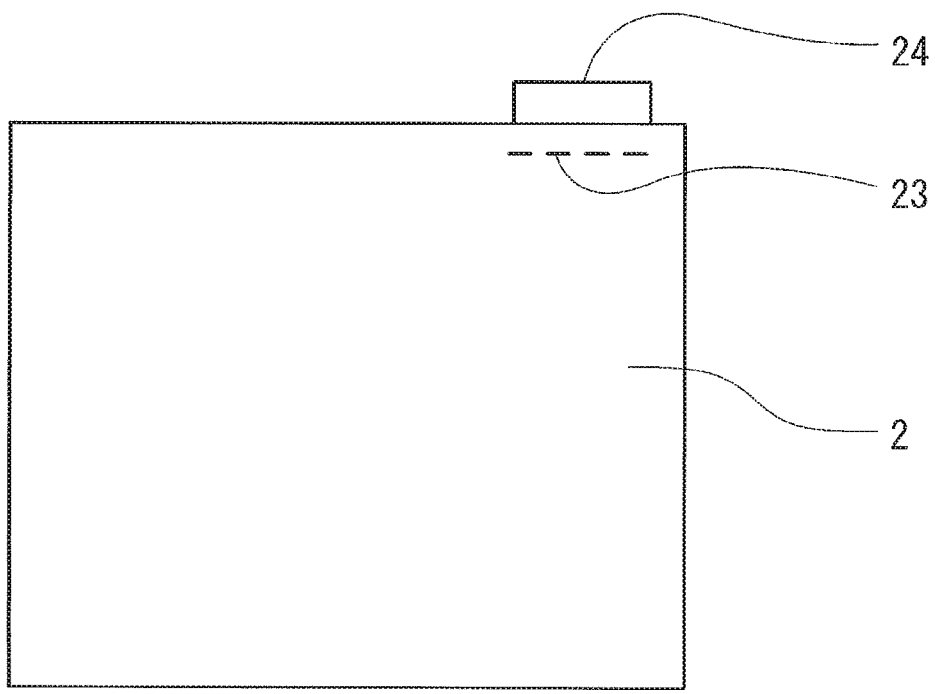
FIG. 15 shows an example of disposition of the scale-like portion in the semiconductor device according to Embodiment 4 of the present invention.

First, in the example shown in FIG. 15, at least one of the first insulating resin member 7 and the second insulating resin member 8 has a gate break mark 24 that is a mark of a resin remaining in the gate of the molding die used in the transfer molding process. The scale-like portion 23 is disposed at the surface of the lead frame 2 adjacent to the gate break mark 24.

Thus, it is possible to improve adhesion between the first insulating resin member 7 or the second insulating resin member 8 and the lead frame 2 adjacent to the gate break mark 24 in which initial detachment is likely to occur.

Figure 16:
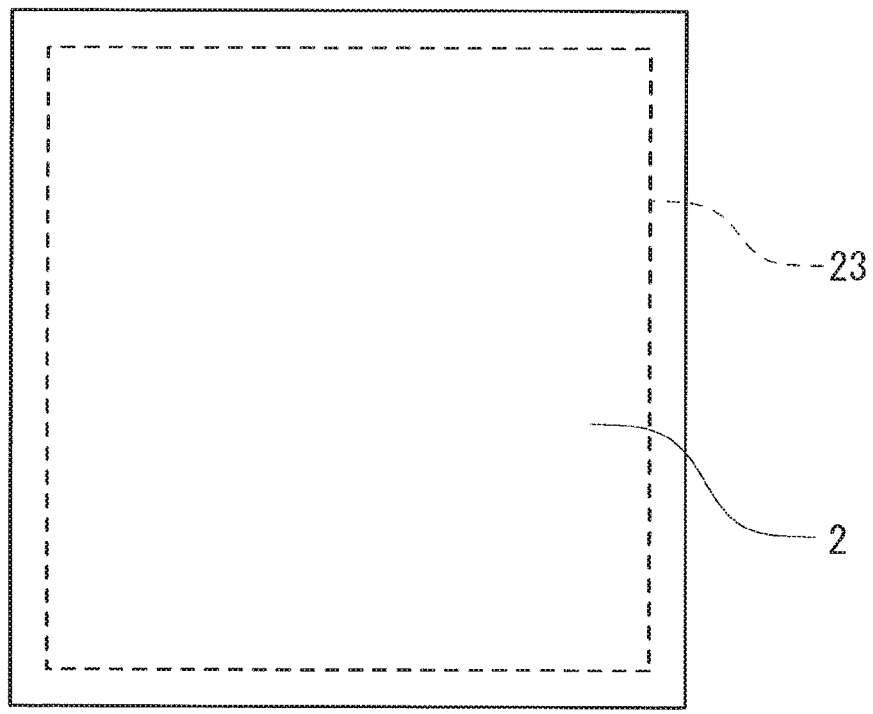
FIG. 16 shows an example of disposition of the scale-like portion in the semiconductor device according to Embodiment 4 of the present invention.

In the example shown in FIG. 16, the scale-like portion 23 is disposed at an outer peripheral portion of at least one of the mounting surface 2a and the heat dissipating surface 2b of the lead frame 2. Thus, it is possible to inhibit initial detachment caused by stress when the semiconductor device 102 is ejected from the molding die and detachment caused by other stress from the outside, thereby advantageously avoiding encroachment of moisture or contaminant into the interior of the first insulating resin member 7 and the second insulating resin member 8.

Figure 17:
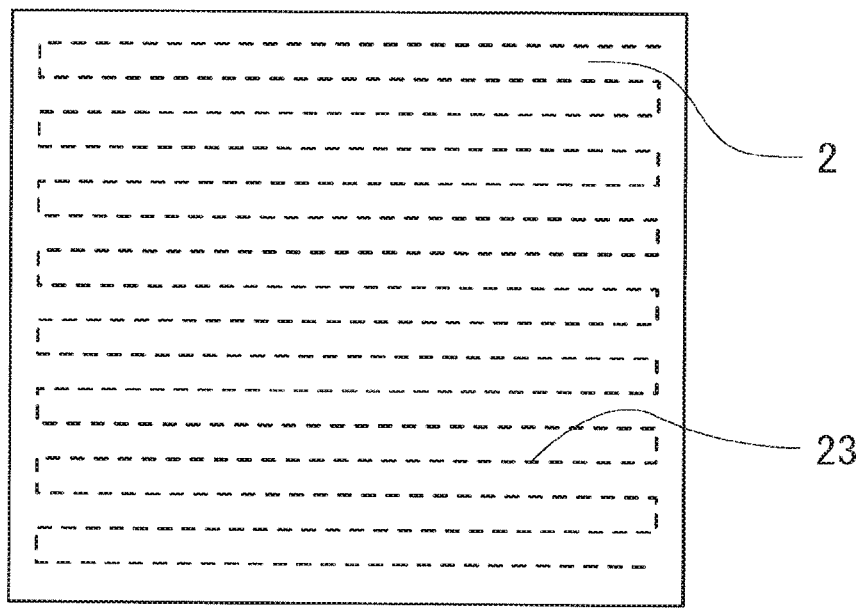
FIG. 17 shows an example of disposition of the scale-like portion in the semiconductor device according to Embodiment 4 of the present invention.

In the example shown in FIG. 17, the scale-like portion 23 is disposed over the entire surface of at least one of the mounting surface 2a and the heat dissipating surface 2b of the lead frame 2. Thus, detachment can be inhibited over the entire surface.

According to Embodiment 4, in addition to the same advantages as in Embodiment 1 to Embodiment 3, adhesion between the lead frame and the first insulating resin member or the second insulating resin member is improved because the scale-like portion is disposed at any position in the lead frame.

Embodiment 5

Figure 18:
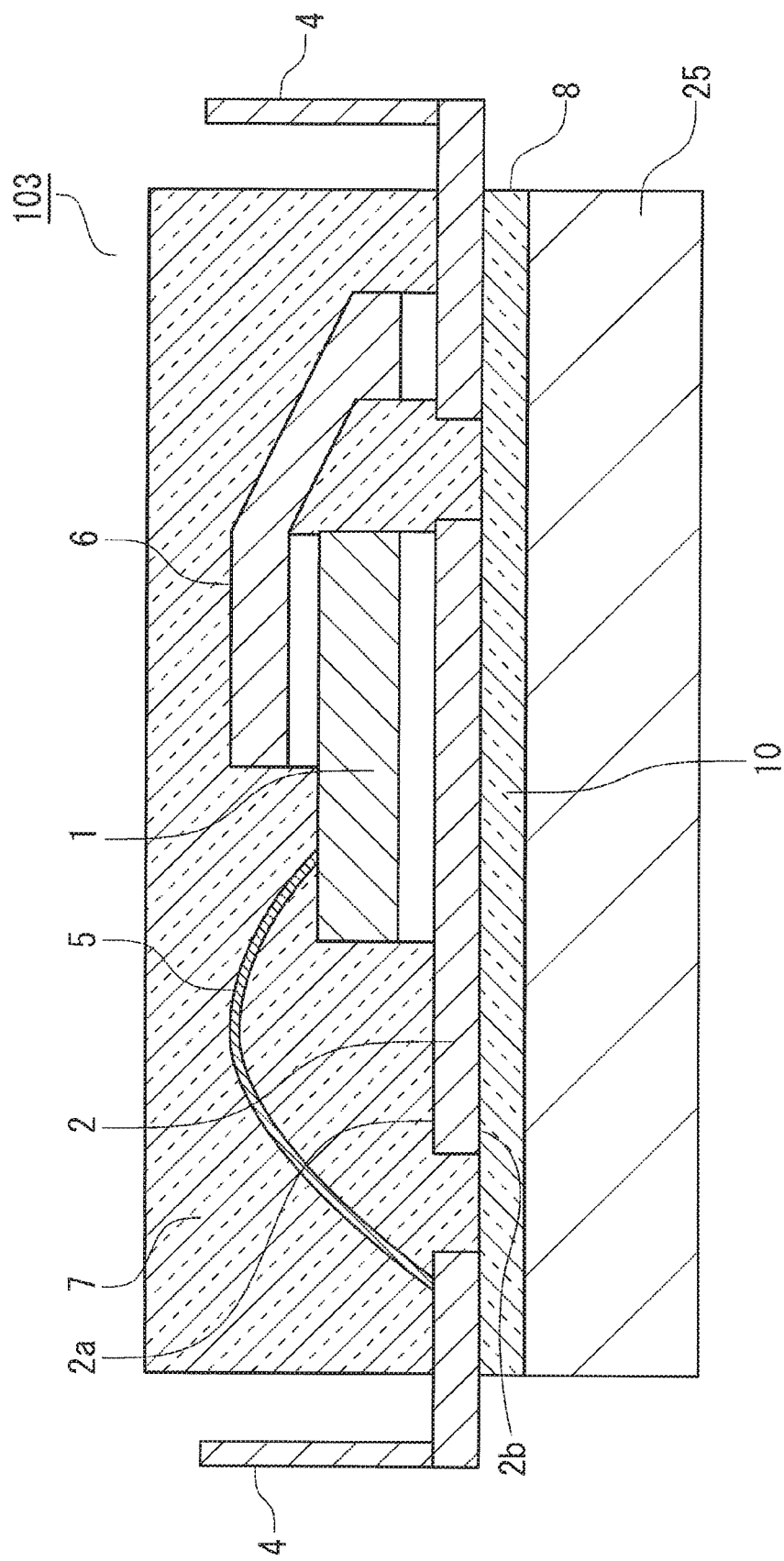
FIG. 18 is a cross-sectional view showing a semiconductor device according to Embodiment 5 of the present invention.
Figure 19:
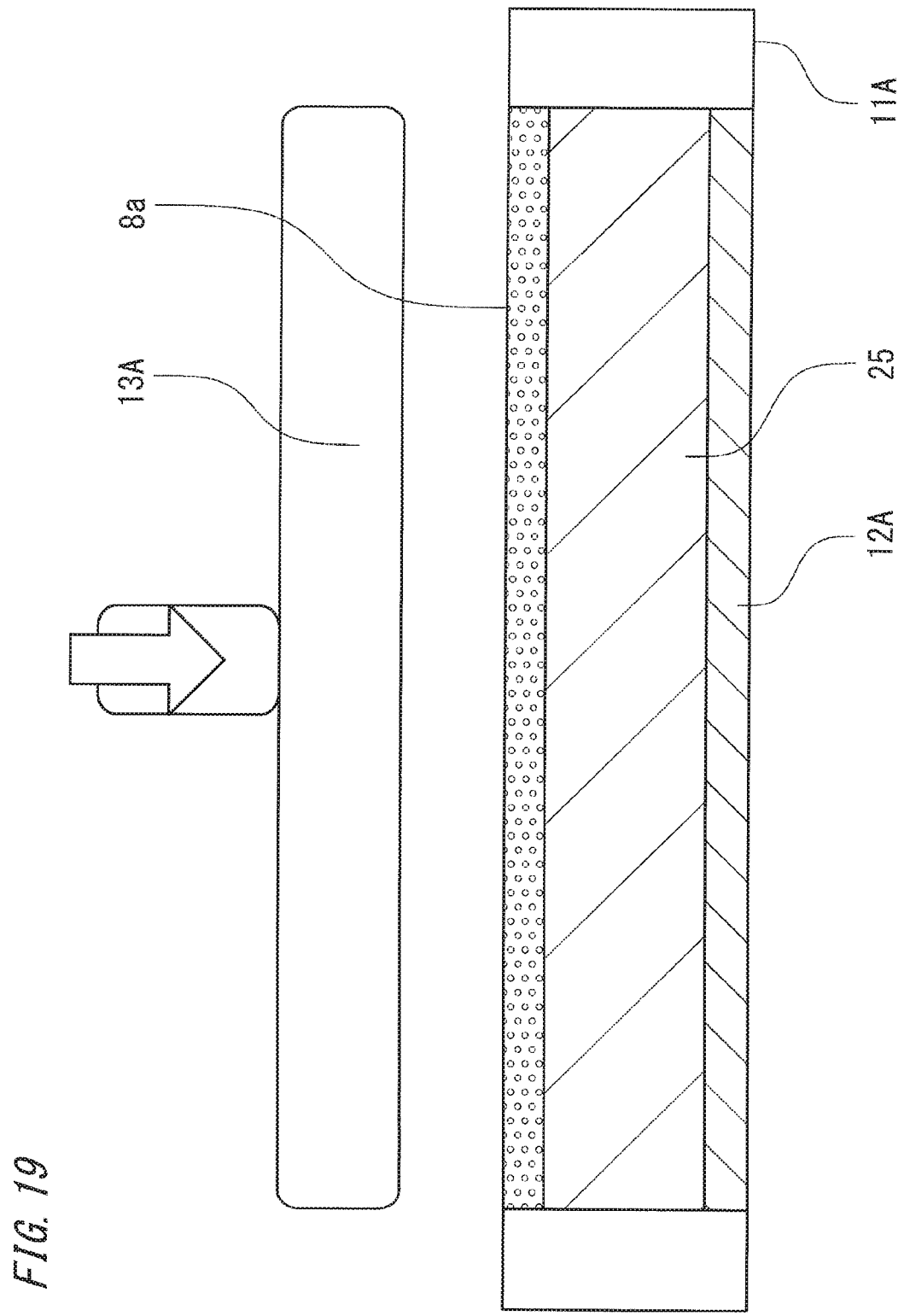
FIG. 19 is a cross-sectional view showing a process for manufacturing the semiconductor device according to Embodiment 5 of the present invention.
Figure 20:
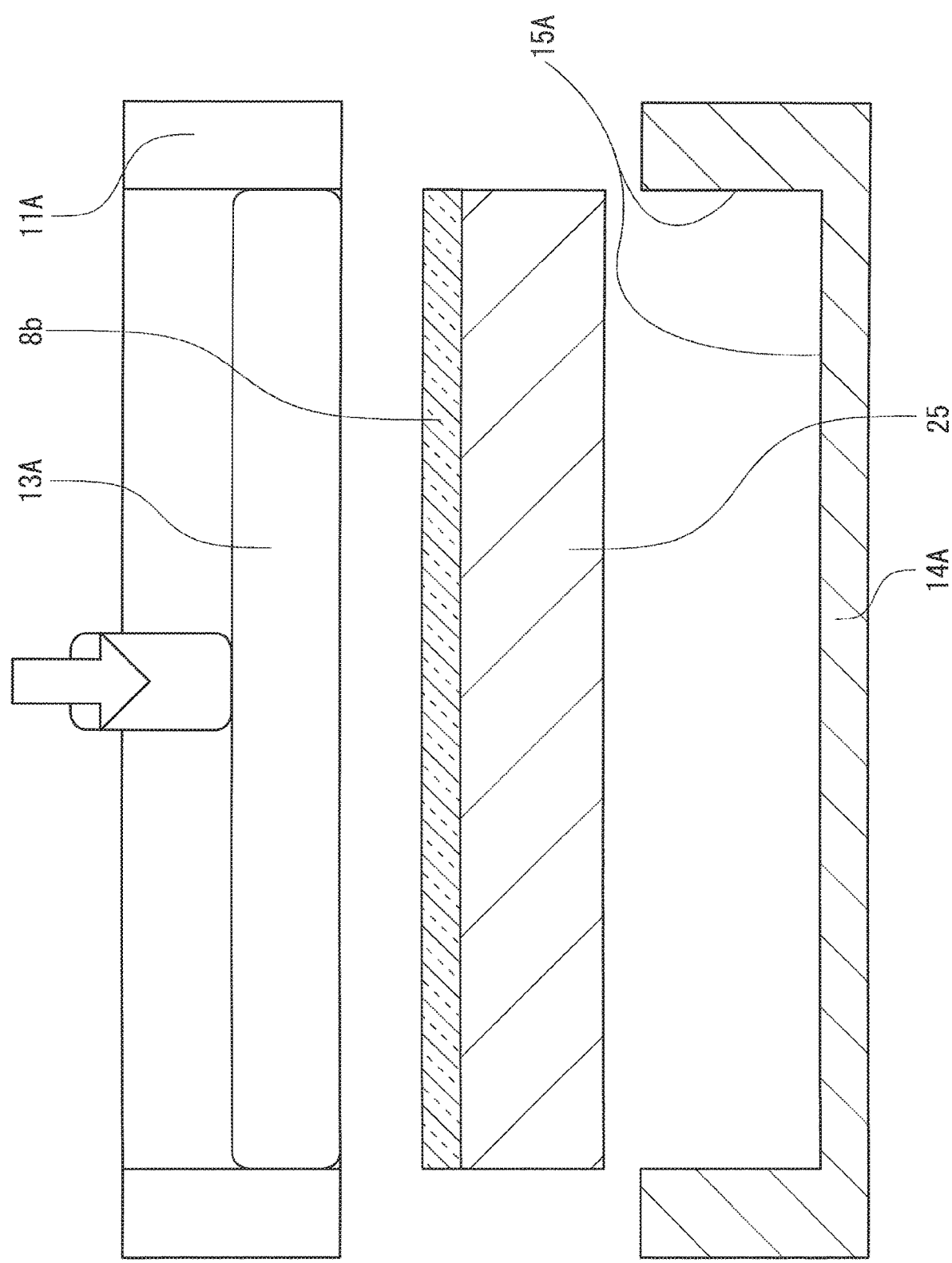
FIG. 20 is a cross-sectional view showing the process for manufacturing the semiconductor device according to Embodiment 5 of the present invention.
Figure 21:
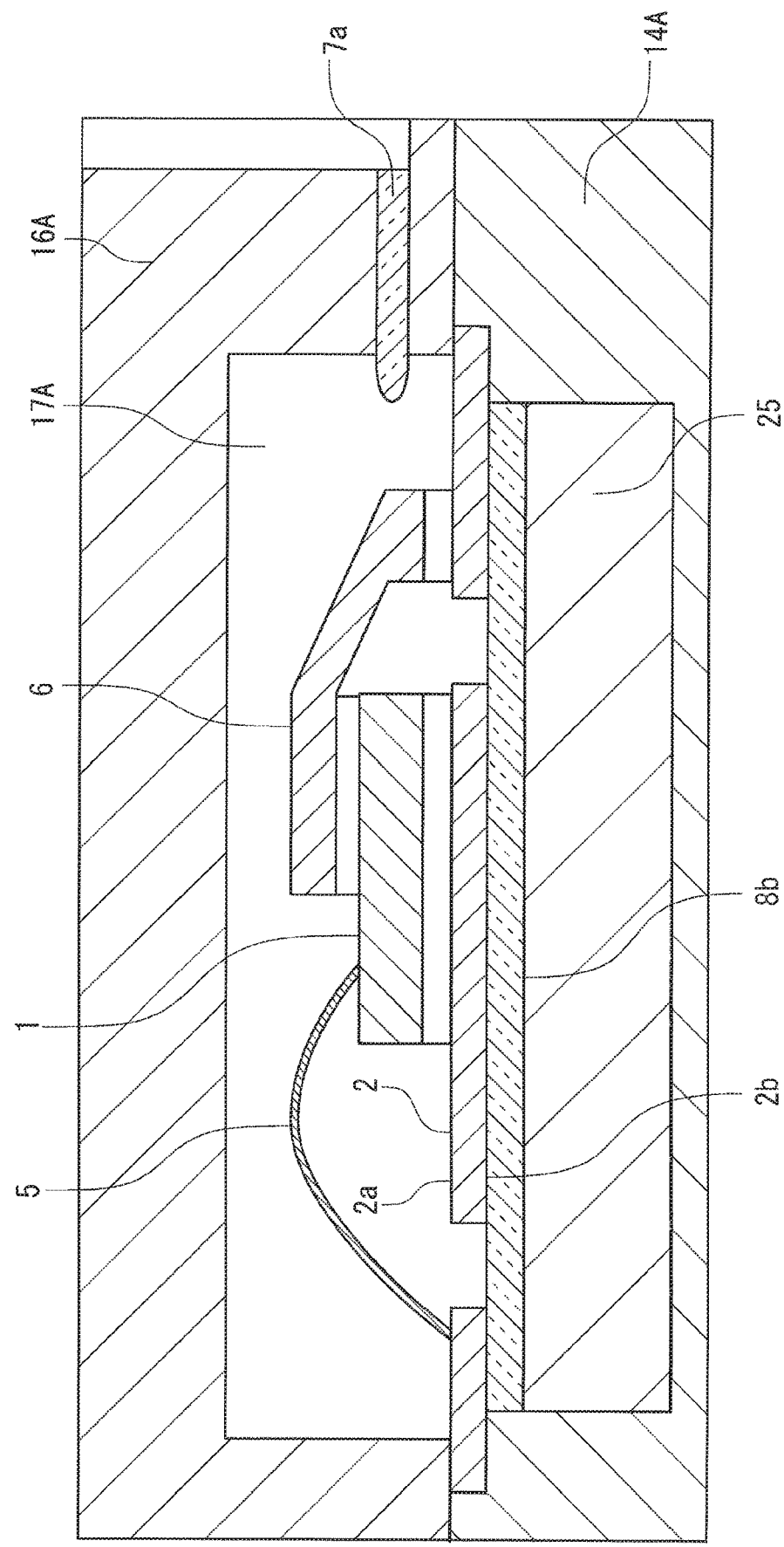
FIG. 21 is a cross-sectional view showing the process for manufacturing the semiconductor device according to Embodiment 5 of the present invention.

FIG. 18 is a cross-sectional view showing a semiconductor device according to Embodiment 5 of the present invention. FIG. 19 to FIG. 21 are cross-sectional views showing a method for manufacturing the semiconductor device according to Embodiment 5. Since the overall configuration of the semiconductor device 103 according to Embodiment 5 is similar to that of the semiconductor device according to any of Embodiment 1 to Embodiment 4, only the differences from Embodiment 1 to Embodiment 4 will be described.

In the semiconductor device 103 according to Embodiment 5, a heat sink 25 is disposed on a surface, of the thin molded portion 10, opposite to the heat dissipating surface 2b of the lead frame 2.

As shown in FIG. 19, a resin molder 11A is a device for molding the powder-like second insulating resin 8a into the sheet-like second insulating resin 8b, and includes a base part 12A. The heat sink 25 is disposed on the base part 12A of the resin molder 11A, and the powder-like second insulating resin 8a is sprayed on the heat sink 25. Thereafter, a punch 13A is moved down toward the powder-like second insulating resin 8a, and compressively molds the powder-like second insulating resin 8a into the sheet-like second insulating resin 8b having a desired shape. Thereafter, the punch 13A is temporarily moved upward.

As shown in FIG. 20, the sheet-like second insulating resin 8b is transferred to a position above the lower die 14A of the transfer molding die while being disposed on the heat sink 25 of the resin molder 11A. When the sheet-like second insulating resin 8b has reached the position above a lower-die cavity 15A of the lower die 14A, the base part 12A beneath the heat sink 25 is removed. Then, the punch 13A is again moved downward, whereby the sheet-like second insulating resin 8b and the heat sink 25 are fitted in the lower-die cavity 15A.

As shown in FIG. 21, on the heat sink 25 and the sheet-like second insulating resin 8b disposed on the lower die 14A, the lead frame 2 on which the semiconductor element 1 is mounted is disposed such that the second insulating resin 8b faces the heat dissipating surface 2b of the lead frame 2. Then, in the state where the sheet-like second insulating resin 8b, the heat sink 25, and the lead frame 2 on which the semiconductor element 1 is mounted are disposed on the lower die 14A, an upper die 16A of the transfer molding die is mounted, followed by transfer molding. The first insulating resin 7a is melted by heat and pressure applied in the lower die 14A and the upper die 16A for transfer molding, passes through the gate, and is injected into an upper-die cavity 17A, whereby the first insulating resin member 7 is formed on the mounting surface 2a of the lead frame 2. At the same time, the sheet-like second insulating resin 8b is melted by heat and pressure applied in the lower die 14 and the upper die 16, whereby the second insulating resin member 8 is formed on the heat dissipating surface 2b of the lead frame 2, and the heat sink 25 is joined to the thin molded portion 10. At this time, since the sheet-like second insulating resin 8b before being cured, which corresponds to the thin molded portion 10, also serves as an adhesive agent, the heat dissipating member such as grease for adhering the heat sink 25 can be omitted.

According to Embodiment 5, in addition to the same advantages as in Embodiment 1 to Embodiment 4, heat dissipation is further improved because the thin molded portion 10 is directly joined to the heat sink 25. Furthermore, after the transfer molding process, the process of joining the heat sink 25 to the thin molded portion 10 via the heat dissipating member such as grease can be omitted.

Figure 22:
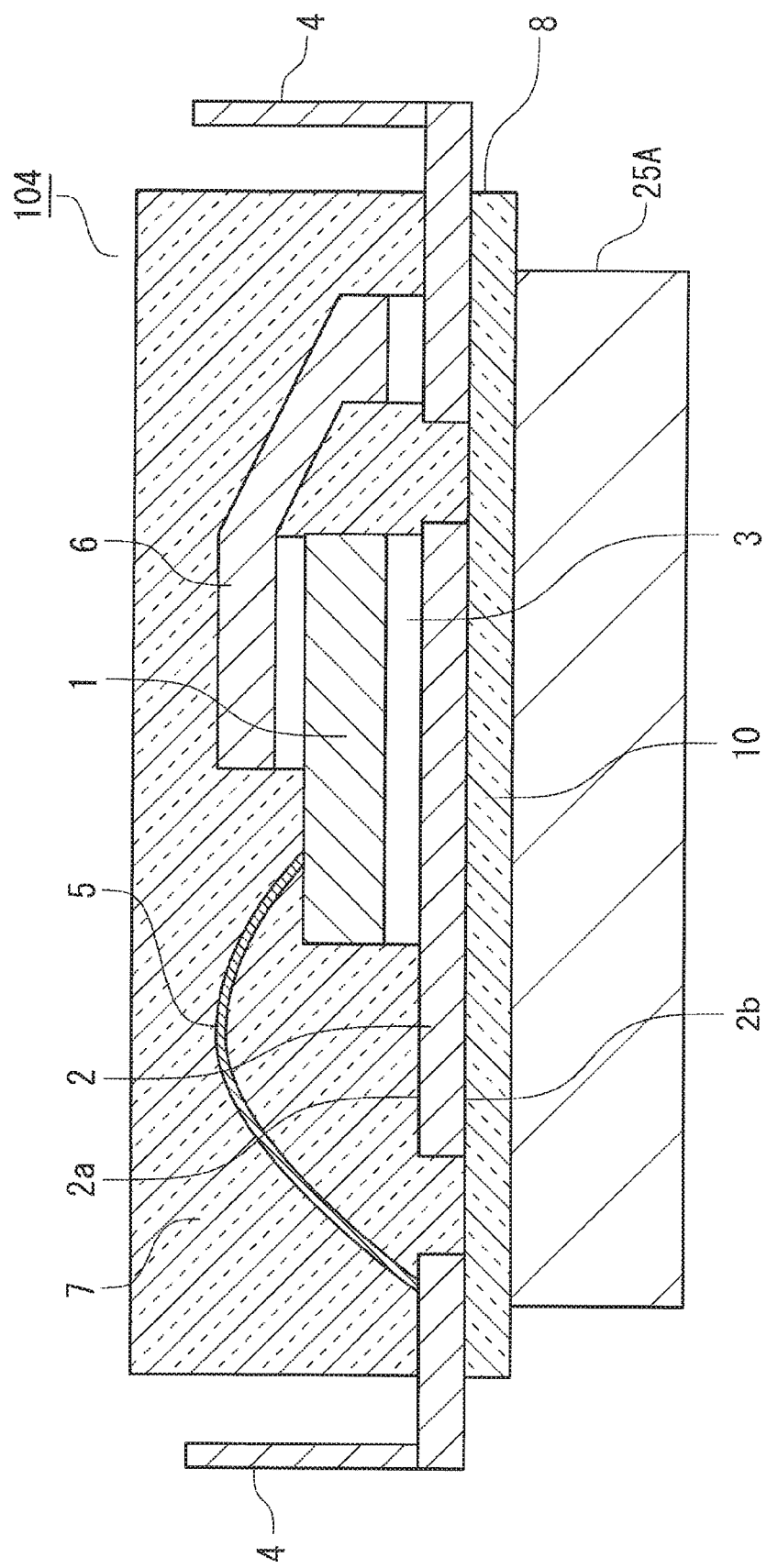
FIG. 22 is a cross-sectional view showing another example of a semiconductor device according to Embodiment 5 of the present invention.

As shown in FIG. 22, a heat sink 25A having a junction area smaller than a heat-dissipation-side area of the thin molded portion 10 may be disposed on a surface, of the thin molded portion 10, opposite to the heat dissipating surface 2b of the lead frame 2. By making the size of the heat sink 25A smaller than that of the thin molded portion 10, the creepage distance can be increased in accordance with withstand voltage performance of the semiconductor element 1 and accuracy of finishing of the heat sink 25A.

Embodiment 6

Figure 23:
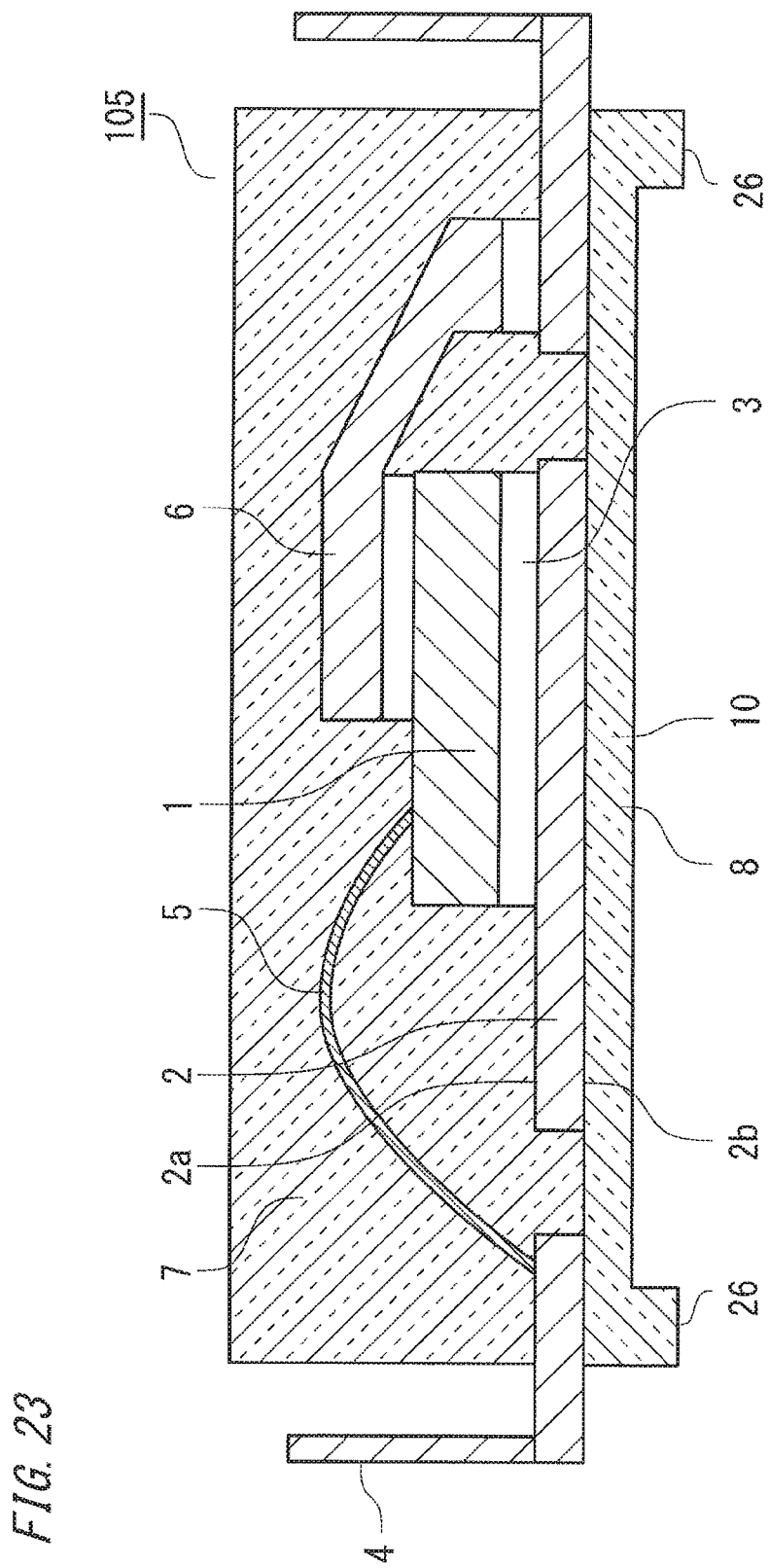
FIG. 23 is a cross-sectional view showing a semiconductor device according to Embodiment 6 of the present invention.

FIG. 23 is a cross-sectional view showing a semiconductor device according to Embodiment 6 of the present invention. Since the overall configuration of the semiconductor device 105 according to Embodiment 5 is similar to that of any of Embodiment 1 to Embodiment 5, only the differences from Embodiment 1 to Embodiment 5 will be described.

As shown in FIG. 23, the second insulating resin member 8 is formed on the heat dissipating surface 2b of the lead frame 2, and a skirt portion 26 that is a frame-like projecting portion having a thickness of about 0.15 mm to 2 mm is formed at an outer peripheral end portion of the second insulating resin member 8.

The thin molded portion 10, which is inside of and surrounded by the skirt portion 26 and has a thickness of about 0.022 mm to 0.15 mm, is integrally molded with the skirt portion 26. Furthermore, the thin molded portion 10 is joined to a heat sink (not shown) made of copper or aluminum via a heat dissipating member such as grease.

According to Embodiment 6, since the skirt portion 26 that is a frame-like projecting portion is provided at the outer peripheral end portion of the second insulating resin member 8, strength of the outer peripheral end portion of the lead frame 2, to which stress is applied at gate break, can be ensured. In addition, since the creepage distance is increased and the insulation is improved, Embodiment 6 is advantageous for a high pressure module using an IGBT as the semiconductor element 1. The cross-sectional shape of the skirt portion 26 in a direction orthogonal thereto is a rectangle, square, trapezoid, or the like.

Embodiment 7

Figure 24:
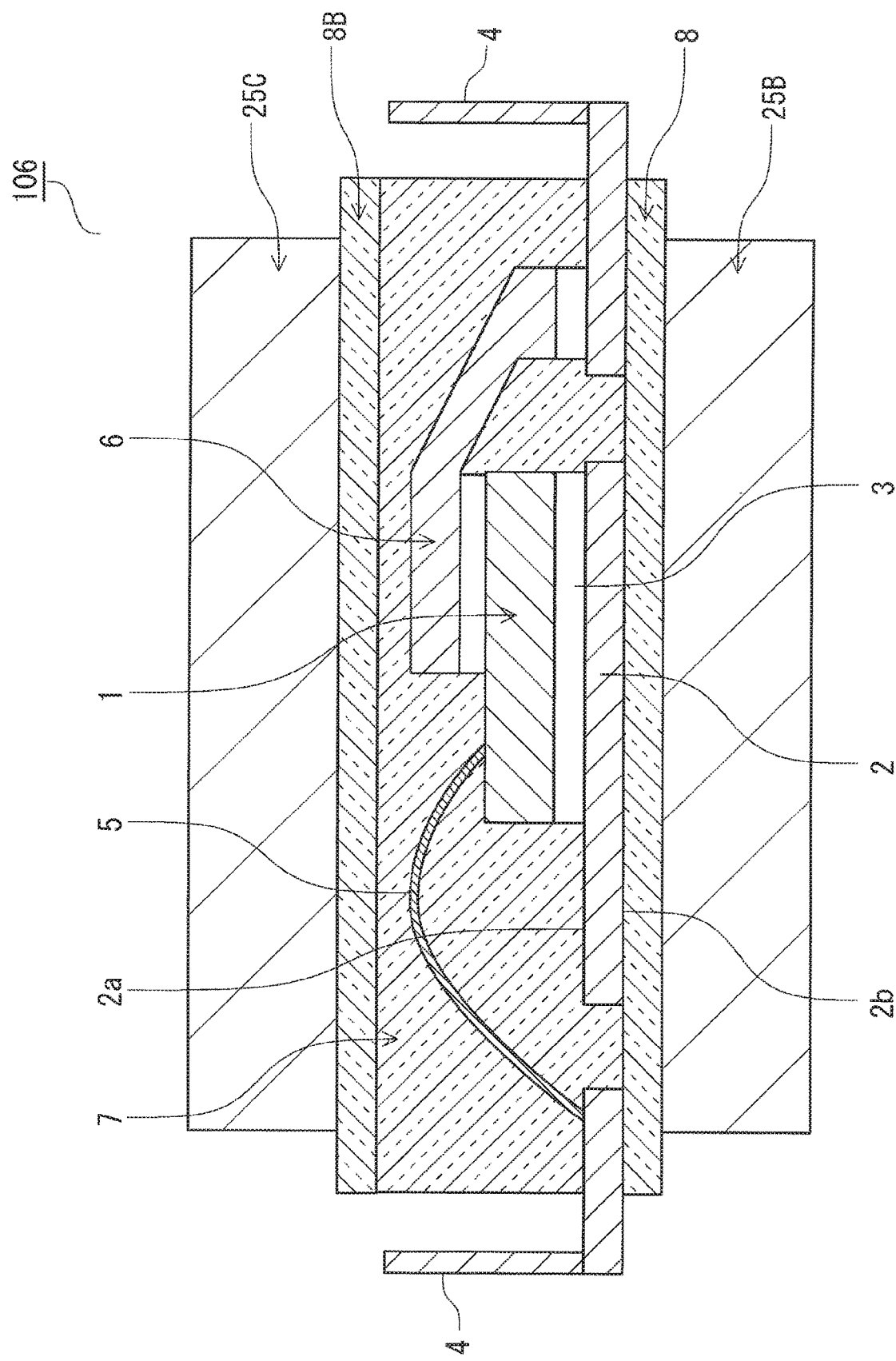
FIG. 24 is a cross-sectional view showing a semiconductor device according to Embodiment 7 of the present invention.

FIG. 24 is a cross-sectional view showing a semiconductor device according to Embodiment 7 of the present invention. Since the semiconductor device 106 according to Embodiment 5 is a modification of the semiconductor device according to any of Embodiment 1 to Embodiment 6, only the differences from Embodiment 1 to Embodiment 6 will be described.

In Embodiment 1 to Embodiment 6, the first insulating resin member 7 is formed on the mounting surface 2a of the lead frame 2, and the second insulating resin member 8 is formed on the heat dissipating surface 2b of the lead frame 2. In Embodiment 7, however, a second insulating resin member 8B is formed also on the mounting surface 2a side of the lead frame 2 to provide a heat dissipating portion. That is, in the semiconductor device 106 according to Embodiment 7, the second insulating resin member 8B is formed on a surface, of the first insulating resin member 7, facing the mounting surface 2a, of the lead frame 2, on which the semiconductor element 1 is mounted, and furthermore, a heat sink 25B is disposed on the second insulating resin member 8B.

As described above, according to Embodiment 7, since the first insulating resin member 7 disposed on the mounting surface 2a side of the lead frame 2 is caused to have heat dissipation, the periphery of the semiconductor element 1 as a heat-generating component can be sealed with the highly heat-conductive resin. In this case, since heat is dissipated from the entire periphery of the semiconductor element 1, heat dissipation is improved.

In the aforementioned embodiments, the resin molder 11 may be incorporated in a molding apparatus capable of transfer molding using a molding die, or may be provided as a separate apparatus.

In the aforementioned embodiments, in order to improve adhesion of the first insulating resin member 7 and the second insulating resin member 8 to the lead frame 2, the surface of the lead frame 2 may be subjected to ultraviolet (UV) treatment or plasma treatment before the transfer molding process.

The shape, number, and arrangement of each of the components of the semiconductor devices according to the aforementioned embodiments, for example, the semiconductor element 1, the external terminal 4, the wire 5, and the inner lead 6, are not particularly limited, but are selected as appropriate in accordance with functions required of the semiconductor device.

In addition, within the scope of the present invention, the above embodiments may be freely combined with each other, or each of the above embodiments may be modified or simplified as appropriate.

The invention claimed is:

1. A semiconductor device including:
   a lead frame on which a semiconductor element is mounted;
   a first insulating resin member sealing a mounting surface, of the lead frame, on which the semiconductor element is mounted; and
   a second insulating resin member sealing a heat dissipating surface, of the lead frame, opposite to the mounting surface, wherein
   the second insulating resin member contains a filler having a maximum diameter of 0.02 mm to 0.075 mm, and
   the second insulating resin member includes a thin molded portion formed in contact with the heat dissipating surface of the lead frame, the thin molded portion having a thickness 1.1 times to 2 times the maximum diameter of the filler,
   the semiconductor device includes, at an interface between the first insulating resin member and the second insulating resin member, a mixture layer in which a first material of the first insulating resin member and a second material of the second insulating resin member are mixed with each other.

2. The semiconductor device according to claim 1, wherein a lead frame space filled portion of the first insulating resin member is formed in an entire space between two separated regions of the lead frame.

3. The semiconductor device according to claim 2, wherein a contact surface between the first insulating resin member and the second insulating resin member in the two separated regions of the lead frame, and the heat dissipating surface are provided at a same level.

4. The semiconductor device according to claim 1, wherein a lead frame space filled portion of the second insulating resin member is provided between two separated regions of the lead frame,
   wherein the semiconductor device further comprises depressions and projections at a side surface of the lead frame on which the lead frame space filled portion is formed, and
   wherein the depressions and projections are burrs.

5. The semiconductor device according to claim 1, wherein a roughened metal plating lead frame having a surface coated with roughened metal plating is used as the lead frame.

6. The semiconductor device according to claim 1, wherein the lead frame is coated with metal plating, and includes a scale-like portion obtained by distorting a surface of the metal plating into a scale form.

7. The semiconductor device according to claim 6, wherein at least one of the first insulating resin member and the second insulating resin member has a gate break mark, and the scale-like portion is disposed on a surface, of the lead frame, corresponding to the gate break mark.

8. The semiconductor device according to claim 6, wherein the scale-like portion is disposed at an outer peripheral portion of at least one of the mounting surface and the heat dissipating surface of the lead frame.

9. The semiconductor device according to claim 6, wherein the scale-like portion is disposed on an entire surface of at least one of the mounting surface and the heat dissipating surface of the lead frame.

10. The semiconductor device according to claim 1, wherein a resin having thermal conductivity higher than thermal conductivity of the first insulating resin member is used for the second insulating resin member.

11. The semiconductor device according to claim 1, wherein an insulating resin having thermal conductivity of 3 W/m·K to 12 W/m·K is used for the second insulating resin member.

12. The semiconductor device according to claim 11, wherein an insulating resin having thermal conductivity of 3 W/m·K to 12 W/m·K is used for the first insulating resin member.

13. The semiconductor device according to claim 1, wherein a heat sink is joined to a surface, of the thin molded portion, opposite to a surface, of the thin molded portion, facing the heat dissipating surface of the lead frame, such that a junction area of the heat sink is smaller than a heat dissipation side area of the thin molded portion.

14. The semiconductor device according to claim 1, wherein a frame-like projecting portion is provided at an outer peripheral end portion of the second insulating resin member, and the thin molded portion is integrally formed within the frame-like projecting portion.

15. A method for manufacturing a semiconductor device, the method comprising:
   molding a powder-like second insulating resin into a sheet-like second insulating resin by using a resin molder;
   transferring the sheet-like second insulating resin to a position above a lower die while being disposed on the resin molder, and placing the sheet-like second insulating resin on the lower die;
   disposing a lead frame on which a semiconductor element is mounted, on the sheet-like second insulating resin disposed on the lower die; and
   mounting an upper die to the lower die, and performing transfer molding to form a first insulating resin member sealing a mounting surface, of the lead frame, on which the semiconductor element is mounted, and a second insulating resin member sealing a heat dissipating surface, of the lead frame, opposite to the mounting surface.

16. A method for manufacturing a semiconductor device, the method comprising:
   molding a powder-like second insulating resin into a sheet-like second insulating resin on a heat sink by using a resin molder;
   transferring the sheet-like second insulating resin molded on the heat sink to a position above a lower die while being disposed on the resin molder together with the heat sink, and placing the sheet-like second insulating resin and the heat sink on the lower die;
   disposing a lead frame on which a semiconductor element is mounted, on the sheet-like second insulating resin and the heat sink disposed on the lower die; and
   mounting an upper die to the lower die, and performing transfer molding, thereby forming a first insulating resin member sealing a mounting surface, of the lead frame, on which the semiconductor element is mounted, and a second insulating resin member sealing a heat dissipating surface, of the lead frame, opposite to the mounting surface, and joining the heat sink to the second insulating resin member.

17. The method for manufacturing the semiconductor device according to claim 15, further comprising, before the semiconductor element is mounted on the mounting surface of the lead frame, forming metal plating on a surface of the lead frame, and subjecting the metal plating to laser irradiation to form a scale-like portion in which the surface of the metal plating is distorted into a scale form.

18. The method for manufacturing the semiconductor device according to claim 16, further comprising, before the semiconductor element is mounted on the mounting surface of the lead frame, forming metal plating on a surface of the lead frame, and subjecting the metal plating to laser irradiation to form a scale-like portion in which the surface of the metal plating is distorted into a scale form.

19. The semiconductor device according to claim 2, wherein a roughened metal plating lead frame having a surface coated with roughened metal plating is used as the lead frame.

20. The semiconductor device according to claim 2, wherein the lead frame is coated with metal plating, and includes a scale-like portion obtained by distorting a surface of the metal plating into a scale form.

* * * * *